(12) United States Patent
Reznik

(10) Patent No.: US 8,817,882 B2
(45) Date of Patent: Aug. 26, 2014

(54) CODING BLOCKS OF DATA USING A GENERALIZED FORM OF GOLOMB CODES

(75) Inventor: Yuriy Reznik, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 328 days.

(21) Appl. No.: 13/069,655

(22) Filed: Mar. 23, 2011

(65) Prior Publication Data

US 2012/0027077 A1 Feb. 2, 2012

Related U.S. Application Data

(60) Provisional application No. 61/369,280, filed on Jul. 30, 2010.

(51) Int. Cl.
| | |
|---|---|
| H04N 7/12 | (2006.01) |
| H04N 11/02 | (2006.01) |
| H04N 11/04 | (2006.01) |
| H04N 7/26 | (2006.01) |
| H03M 7/40 | (2006.01) |
| H04N 7/50 | (2006.01) |

(52) U.S. Cl.
CPC ........... *H03M 7/40* (2013.01); *H04N 19/00951* (2013.01); *H04N 19/00781* (2013.01); *H04N 19/00957* (2013.01)
USPC ...................................................... 375/240.2

(58) Field of Classification Search
CPC ....... H03M 7/40; H03M 7/4006; H03M 7/30; H04N 19/00121; H04N 9/00951; G06F 12/04
USPC .............................. 375/240.2, 240.22, 240.23, 375/240.01–240.27; 341/51–107
See application file for complete search history.

(56) References Cited

U.S. PATENT DOCUMENTS

| 5,764,374 A | 6/1998 | Seroussi et al. |
| 7,321,697 B2 | 1/2008 | Sudharsanan et al. |

(Continued)

FOREIGN PATENT DOCUMENTS

| WO | WO2006108463 | 10/2006 |
| WO | WO2007149383 A2 | 12/2007 |

OTHER PUBLICATIONS

Kiely, A. et al., "Generalized Golomb Codes and Adaptive Coding of Wavelet-Transformed Image Subbands," IPN PR 42-154, Jet Propulsion Laboratory, California Institute of Technology, Apr.-Jun. 2003, Aug. 15, 2003, pp. 1-14.

(Continued)

*Primary Examiner* — Andy Rao
*Assistant Examiner* — Jared Walker
(74) *Attorney, Agent, or Firm* — John Rickenbrode; Tood E. Marlette

(57) ABSTRACT

In general, techniques are described for coding blocks of data using a generalized form of Golomb codes. In one example, a device may implement these techniques for encoding data that includes samples, each of which includes a set of values. The device includes a lossless coding unit. This lossless coding unit comprises a sample summation unit that computes a sum of the values of a first one of the samples and a counting unit that determines a sample index. The lossless coding unit further includes a variable length coding unit that codes the computed sum using a variable-length code to generate a coded sum and a uniform coding unit that codes the determined sample index using a uniform code to generate a coded sample index. The lossless coding unit also includes a format unit that combines the coded sum and the coded sample index to form a bitstream.

40 Claims, 10 Drawing Sheets

(56) References Cited

U.S. PATENT DOCUMENTS

| | | | |
|---|---|---|---|
| 7,433,824 B2* | 10/2008 | Mehrotra et al. | 704/501 |
| 2004/0184538 A1* | 9/2004 | Abe et al. | 375/240.12 |
| 2006/0103556 A1* | 5/2006 | Malvar | 341/63 |
| 2006/0235865 A1* | 10/2006 | Sperschneider et al. | 707/101 |
| 2007/0046504 A1 | 3/2007 | Ridge et al. | |
| 2009/0232408 A1* | 9/2009 | Meany | 382/246 |
| 2010/0027903 A1 | 2/2010 | Takamura | |

OTHER PUBLICATIONS

M. Baer, "Optimal Prefix Codes for Infinite Alphabets With Nonlinear Costs," IEEE Transactions on Information Theory, vol. 54, No. 3, Mar. 2008, pp. 1273-1286.

Marcelo J. W., et al., "LOCO-I: A Low Complexity, Context-Based, Lossless Image Compression Algorithm," pp. 11.

N. Merhav et al., "Optimal Prefix Codes for Sources with Two-Sided Geometric Distributions," IEEE Transactions on Information Theory, Aug. 2002, 35 pp.

R. F. Rice et al., "Adaptive variable length coding for efficient compression of spacecraft television data," IEEE Trans. Comm. Tech., vol. COM-19, No. 1, pp. 889-897, 1971.

R. F. Rice, "Some practical universal noiseless coding techniques," Tech. Rep. JPL-79-22, Jet Propulsion Laboratory, Pasadena, CA, Mar. 1979.

R. G. Gallager et al., "Optimal Source Codes for Geometrically Distributed Integer Alphabets," IEEE Trans. Inform. Theory, vol. 21, No. 3, pp. 228-230, 1975.

Recommendation ITU-T G.711.1, "Series G: Transmission Systems and Media, Digital Systems and Networks—Digital Terminal Equipments—Coding of Analogue Signals by Pulse Code Modulation (Wideband Embedded Extension for G.711 Pulse Code Modulation)," Mar. 2008, 82 pages.

Reznik Y: "Coding of prediction residual in MPEG-4 standard for lossless audio coding (MPEG-4 ALS)" Acoustics, Speech, and Signal Processing, 2004. Proceedings. (ICASSP'04). IEEE International Conference on Montreal, Quebec, Canada May 17-21, 2004, Piscataway, NJ, USA,IEEE, Piscataway, NJ, USA, vol. 3, May 17, 2004, pp. 1024-1027, XP010718367 ISBN: 978-0-7803-8484-2 .Section 1.

Ryabko B et al: "Fast codes for large alphabet sources and its application to block encoding" Proceedings 2003 IEEE International Symposium on Information Theory. ISIT 03. Yokohama, Japan, Jun. 29-Jul. 4, 2003? IEEE International Symposium on Information Theory, New York, NY : IEEE, US, Jun. 29, 2003, pp. 112-112, XP010657140 ISBN: 0-7803-7728-1.

S. W. Golomb, "Run-Length Encodings," IEEE Trans. Inform. Theory, vol. 12, No. 7, pp. 399-401, 1966.

T. Liebchen et al., "MPEG-4 ALS: an Emerging Standard for Lossless Audio Coding," Proc. Data Compression Conference, Snowbird, UT, 2004, pp. 439-448.

Final Text of ISO/IEC 13818-7 AAC, 1 AVC Meeting; Nov. 13, 1990-Nov. 16, 1990; The Hague; (CCITT SGXVEXPERT Group for ATM Video Coding), XX, XX, No. N1650, Apr. 11, 1997, XP030010416.

International Search Report and Written Opinion—PCT/US2011/046006—ISA/EPO—Nov. 8, 2011.

Xue S, et al., "Hybrid Golomb codes for a group of quantised GG sources", IEE Proceedings: Vision, Image and Signal Processing, Institution of Electrical Engineers, GB, vol. 150, No. 4, Aug. 27, 2003, pp. 256-260, XP006021077, ISSN: 1350-245X, DOI: 10.1049/IP-VIS:20030510.

* cited by examiner

CODING BLOCKS OF DATA USING A GENERALIZED FORM OF GOLOMB CODES

This application claims the benefit of U.S. Provisional Application No. 61/369,280, filed Jul. 30, 2010, which is hereby incorporated by reference in its entirety.

TECHNICAL FIELD

This disclosure relates to data compression and, more particularly, data compression using generalized Golomb codes.

BACKGROUND

Data compression is widely used in a variety of applications to reduce consumption of data storage space, transmission bandwidth, or both. Example applications of data compression include digital video, image, speech, and audio coding. Digital video coding, for example, is used in wide range of devices, including digital televisions, digital direct broadcast systems, wireless communication devices, personal digital assistants (PDAs), laptop or desktop computers, digital cameras, digital recording devices, video gaming devices, cellular or satellite radio telephones, or the like. Digital video devices implement video compression techniques, such as MPEG-2, MPEG-4, or H.264/MPEG-4 Advanced Video Coding (AVC), to transmit and receive digital video more efficiently.

In general, video compression techniques perform spatial prediction, motion estimation and motion compensation to reduce or remove redundancy inherent in video data. In particular, intra-coding relies on spatial prediction to reduce or remove spatial redundancy in video within a given video frame. Inter-coding relies on temporal prediction to reduce or remove temporal redundancy in video within adjacent frames. For inter-coding, a video encoder performs motion estimation to track the movement of matching video blocks between two or more adjacent frames. Motion estimation generates motion vectors, which indicate the displacement of video blocks relative to corresponding video blocks in one or more reference frames. Motion compensation uses the motion vector to generate a prediction video block from a reference frame. After motion compensation, a residual video block is formed by subtracting the prediction video block from the original video block.

A video encoder applies transform, quantization and lossless statistical coding processes to further reduce the bit rate of the residual block produced by the video coding process. Lossless statistical encoding techniques (sometimes also referred to as "entropy coding") are used in the final stages of a video encoder-decoder (CODEC), and in various other coding applications, prior to storage or transmission of the encoded data. Lossless encoding generally involves the application of codes, which may be fixed-length, variable length codes (often, referred to as variable length codes or VLC), or arithmetic codes to further compress residual coefficients produced by the transform and quantization operations. Examples of lossless coding techniques include context-adaptive binary arithmetic coding (CABAC) and context-adaptive variable length coding (CAVLC), which may be used as alternative lossless coding modes in some encoders. A video decoder performs lossless decoding to decompress residual information for each of the blocks, and reconstructs the encoded video using motion information and the residual information.

SUMMARY

In general, techniques are described for coding data using generalized Golomb codes. These techniques may be employed during lossless statistical coding, which is commonly referred to as "entropy coding," to improve coding efficiency. By using these generalized Golomb codes in this manner, the techniques may permit efficient coding of values in a stream of data whose occurrences in the stream of data can be approximated by certain statistical distributions, such as a geometric distributions or double geometric distributions. These techniques may enable coding of values that exhibit these distributions when conventional Golomb or Golomb-Rice coding techniques result in inefficient coding of the values in the stream of data. Rather than employ Golomb or Golomb-Rice coding techniques that have been modified with a number of qualifiers to prevent using these codes when they become inefficient, the techniques enable a generalized application of Golomb codes even when conventional applications of Golomb or Golomb-Rice codes result in highly inefficient codes.

In one aspect, a method of encoding data comprising samples, each of which includes a set of values, the method comprising computing, with a coding device, a sum of the values of a first one of the samples and determining, with a coding device, a sample index that uniquely identifies the first one of the samples in a set of all possible samples having a same length as that of the first one of the samples and that sum to the same sum as that of the values of the first one of the samples. The method further comprising coding, with the coding device, the computed sum using a variable-length code to generate a coded sum, coding, with the coding device, the determined sample index using a uniform code to generate a coded sample index, wherein the uniform code comprises either a fixed length code or a code in which the difference between code lengths is at most one, combining, with the coding device, the coded sum and the coded sample index to form a bitstream and outputting, with the coding device, the bitstream.

In another aspect, a device for encoding data comprising samples, each of which includes a set of values, the device comprising a lossless coding unit. The lossless coding unit includes a sample summation unit that computes a sum of the values of a first one of the samples, a counting unit that determines a sample index that that uniquely identifies the first one of the samples in a set of all possible samples having a same length as that of the first one of the samples and that sum to the same sum as that of the values of the first one of the samples, a variable length coding unit that codes the computed sum using a variable-length code to generate a coded sum and a uniform coding unit that codes the determined sample index using a uniform code to generate a coded sample index, wherein the uniform code comprises either a fixed length code or a code in which the difference between code lengths is at most one. The device further includes a format unit that combines the coded sum and the coded sample index to form a bitstream and outputs the bitstream.

In another aspect, an apparatus for encoding data comprising samples, each of which includes a set of values, the apparatus comprising means for computing a sum of the values of a first one of the samples and means for determining a sample index that that uniquely identifies the first one of the samples in a set of all possible samples having a same length as that of the first one of the samples and that sum to the same sum as that of the values of the first one of the samples. The apparatus further comprising means for coding the computed sum using at least a variable-length code to generate a coded sum, means for coding the determined sample index using a uniform code to generate a coded sample index, wherein the uniform code comprises either a fixed length code or a code in which the difference between code lengths is at most one, means for combining the coded sum and the coded sample index to form a bitstream and means for outputting the bitstream.

In another aspect, a non-transitory computer-readable storage medium having stored thereon instructions that when executed cause a processor of a coding device to receive data defining samples, wherein each of the samples includes a set of values, compute a sum of the set of values for a first one of the samples, determine a sample index that uniquely identifies the first one of the samples in a set of all possible samples having a same length as that of the first one of the samples and that sum to the same sum as that of the values of the first one of the samples, code the computed sum using a variable-length code to generate a coded sum, code the determined sample index using a uniform code to generate a coded sample index, wherein the uniform code comprises either a fixed length code or a code in which the difference between code lengths is at most one, combine the coded sum and the coded sample index to form a bitstream and output the bitstream.

In another aspect, a method for decoding data comprising encoded samples, each of which comprises a coded sum that was coded using a variable length code and a coded sample index that was coded using a uniform code, the method comprising decoding, with the decoding device, the coded sum of a first one of the encoded samples to output a decoded sum. The method further comprising decoding, with the decoding device, the coded sample index of the first one of the encoded samples based on the decoded sum to output a decoded sample index and reconstructing the first one of the encoded samples based on the decoded sample index and the decoded sum to output a reconstructed sample.

In another aspect, a device for decoding data comprising encoded samples, each of which comprises a coded sum that was coded using a variable length code and a coded sample index that was coded using a uniform code, the device comprising a sum reconstruction unit that decodes the coded sum of a first one of the encoded samples to output a decoded sum. The device further comprising a uniform decoding unit that decodes the coded sample index of the first one of the encoded samples based on the decoded sum to output a decoded sample index and a sample reconstruction unit that reconstructs the first one of the encoded samples based on the decoded sample index and the decoded sum to output a reconstructed sample.

In another aspect, an apparatus for decoding data comprising encoded samples, each of which comprises a coded sum that was coded using a variable length code and a coded sample index that was coded using a uniform code, the device comprising means for decoding the coded sum of a first one of the encoded samples based on the decoded sum to output a decoded sum. The device further comprising means for decoding the coded sample index of the first one of the encoded samples to output a decoded sample index and means for reconstructing the first one of the encoded samples based on the decoded sample index and the decoded sum to output a reconstructed sample.

In another aspect, a non-transitory computer-readable medium that stores instructions that, when executed by a processor, cause the processor to receive, with a decoding device, data defining encoded samples, wherein each of the encoded samples comprises a coded sum that was coded using a variable length code and a coded sample index that was coded using a uniform code, decode, with the decoding device, the coded sum of a first one of the encoded samples to output a decoded sum, decode, with the decoding device, the coded sample index of the first one of the encoded samples based on the decoded sum to output a decoded sample index and reconstruct the first one of the encoded samples based on the decoded sample index and the decoded sum to output a reconstructed sample.

The details of one or more aspects of the techniques are set forth in the accompanying drawings and the description below. Other features, objects, and advantages of the techniques will be apparent from the description and drawings, and from the claims.

DETAILED DESCRIPTION

Figure 1:
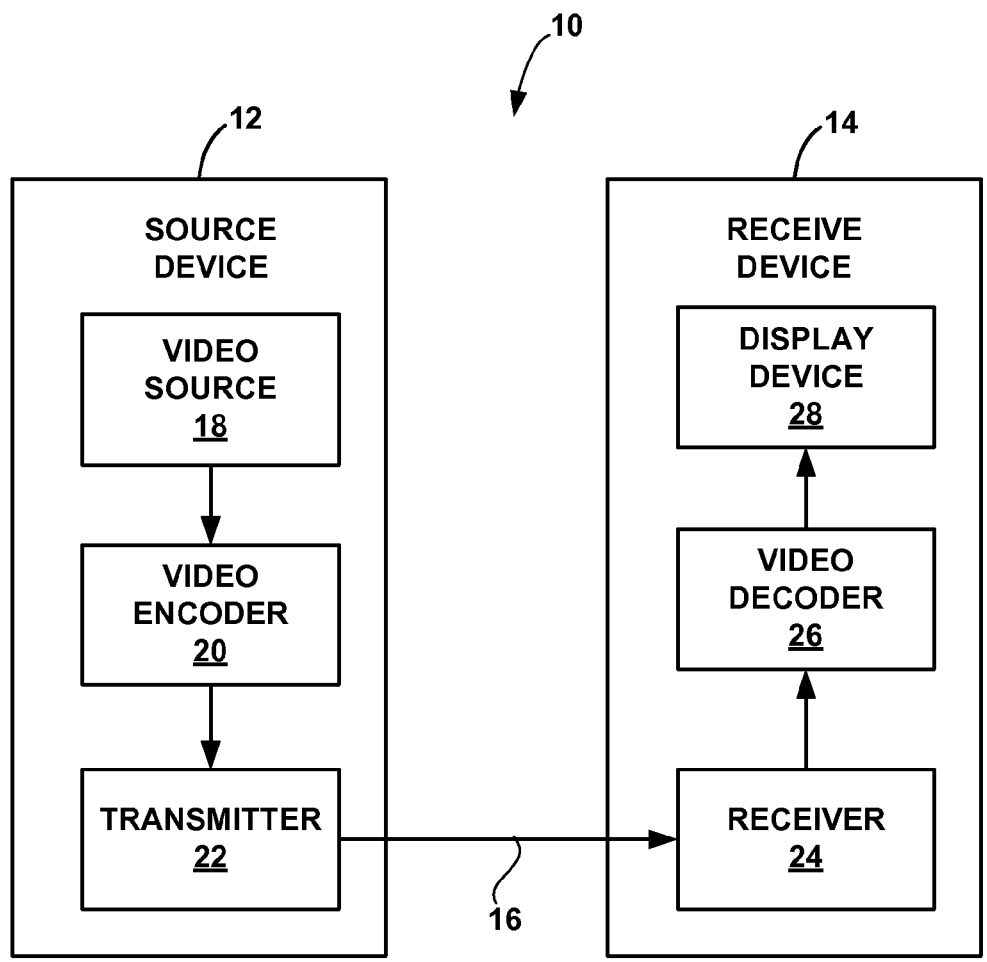
FIG. 1 is a block diagram illustrating a video encoding and decoding system 10.

In general, techniques are described for coding data using generalized Golomb codes. These techniques may be employed during lossless statistical coding, which is commonly referred to as "entropy coding," to improve coding efficiency, as measured by a so-called "redundancy" metric, which is described in more detail below. By using these generalized Golomb codes in this manner, the techniques permit efficient coding of values in a stream of data whose occurrences in the stream of data can be approximated by certain statistical distributions, such as a geometric distributions or double geometric distributions. These techniques may enable coding of values that exhibit these distributions when conventional Golomb or Golomb-Rice coding techniques result in high levels of redundancy, meaning that these conventional coding techniques result in inefficient coding of the values in the stream of data. Rather than employ Golomb or Golomb-Rice coding techniques that have been modified with a number of qualifiers to prevent using these codes when they become inefficient, the techniques enable application of a form of generalized Golomb codes even when conventional applications of Golomb or Golomb-Rice codes result in these high levels of redundancy.

The coding techniques described in this disclosure address deficiencies of Golomb and Golomb-Rice codes when these codes are applied to values in a stream of data whose distribution can be approximated using geometric or double geometric statistical distributions. Specifically, when performing statistical coding, a statistical distribution is fit to the stream of data using parameters. In the case of a double geometric statistical distribution, this distribution resembles a discrete analog of a Laplacian distribution for a continuous variable that depends on two parameters, a first parameter $\mu$ and a second parameter $\theta$. The parameter $\mu$ may be referred to as the location parameter in this disclosure, while the parameter $\theta$ may be referred to as the spread parameter in this disclosure. Golomb codes, or the special case of Golomb codes adapted for binary systems referred to as Golomb-Rice codes, may be particularly sensitive to the spread parameter $\theta$ as this parameter decreases to zero. At small values of the spread parameter $\theta$, employing Golomb codes to code a data sample results in relatively high levels of redundancy. Rather than employ Golomb or Golomb-Rice coding techniques that have been modified with a number of qualifiers to prevent using these codes when they become inefficient, the techniques described in this disclosure enable a generalized application of Golomb codes even when conventional applications of Golomb or Golomb-Rice codes result in these high levels of redundancy.

To implement these coding techniques, a coding device first receives data defining sets of values, wherein the sets of one or more values are distributed according to either a geometric or double geometric distribution. These sets of values may be referred to as a sample. A sample in this instance may refer to any type of data, including data corresponding to the wide variety of applications described above, such as digital video, image, audio or speech data. With respect to digital video data, a sample or set of values may, as one example, refer to quantized Discrete Cosine Transform (DCT) coefficients of a residual block. In another example, a sample, again with respect to digital video data, may refer to pixel values in a block or to a residual block. Each value of the set of values may be referred to as a symbol, as is customary in the area of information theory.

After receiving these sets of values, the coding device computing a sum of a first one of the sets of values. That is, for a first sample, the coding device sums together the values of the sample. Next, the coding device determines an index that distinguishes the computed sum of the first one of the sets of values from other sets of values that also have a computed sum that is the same as the computed sum of the first one of the sets of values. The coding device may determine this index by arranging these samples having the same sum in an order of decreasing probability of occurrence and then assigning an index value to each of the samples having the same sum such that the highest probability sample is assigned an index of one and the lowest highest probability sample is assigned an index equal to the total number of samples that have the same sum. This form of grouping may be referred to as "alphabet grouping." Alternatively, the samples could be arranged in an inverse order or any other mathematically determinable order and the indexes may be assigned as described above or any other mathematically determinable way only with respect to the new ordering.

Once these indexes are determined, the coding device codes the computed sum using a variable-length code to generate a coded sum and then the determined index using a uniform code to generate a coded index. From the coded sum and the coded index, the coding device generates a generalized Golomb code to code the first one of the sets of values. Rather than perform ordinary Golomb-Rice coding, which involves dividing a given input stream by two to form a quotient and reminder and then coding the quotient using a unary code and the remainder using a Rice code or any other binary coding scheme, the techniques of this disclosure form a generalized Golomb code from a coded index determined using alphabetic grouping and a coded sum. This form of the Golomb code is generalized in that the coding device need not implement any special qualifiers or algorithms to handle or otherwise prevent the application of Golomb-Rice codes to code values in a stream of data that otherwise, due to the nature of the distribution of such values in the stream, would result in coding inefficiencies. Instead, the techniques enable a modified form of Golomb coding that is capable of coding values in a stream of data that are distributed in a way that can be approximated by a geometric or double geometric statistical distribution despite how these distributions are fit to the values in the stream of data (or, in other words, regardless of the value of the spread parameter).

In this respect, the techniques may improve upon ordinary Golomb or Golomb-Rice coding to provide for increased coding efficiency when used to code sets of values in a stream of data whose distributions can be approximated by a geometric or double geometric distribution. As no special qualifiers are required to implement this generalized form of Golomb coding, the techniques may reduce implementation complexity. Considering that each operation performed by a coding device generally consumes power, the reduced implementation complexity may result in less power consumption, which is particularly beneficial for portable devices, such as a cellular phone or handset, that often rely on a battery to power the device for extended periods of time. In this way, the techniques not only may improve coding efficiency for the samples having values distributed in accordance with a geometric or double-geometric distribution but also may reduce implementation complexity by avoiding qualifiers, which reduces power consumption.

FIG. 1 is a block diagram illustrating a video encoding and decoding system 10. As shown in FIG. 1, system 10 includes a source device 12 that transmits encoded video to a receive device 14 via a communication channel 16. Source device 12 may include a video source 18, video encoder 20 and a transmitter 22. Destination device 14 may include a receiver 24, video decoder 26 and video display device 28. System 10 may be configured to apply a generalized form of Golomb coding techniques described in this disclosure to promote more efficient coding of data that promotes reduced implementation complexity and power conservation.

In the example of FIG. 1, communication channel 16 may comprise any wireless or wired communication medium, such as a radio frequency (RF) spectrum or one or more physical transmission lines, or any combination of wireless and wired media. Channel 16 may form part of a packet-based network, such as a local area network, wide-area network, or a global network such as the Internet. Communication channel 16 generally represents any suitable communication medium, or collection of different communication media, for transmitting video data from source device 12 to receive device 14.

Source device 12 generates video for transmission to destination device 14. In some cases, however, devices 12, 14 may operate in a substantially symmetrical manner. For example, each of devices 12, 14 may include video encoding and decoding components. Hence, system 10 may support one-way or two-way video transmission between video devices 12, 14, e.g., for video streaming, video broadcasting, or video telephony. For other data compression and coding applications, devices 12, 14 could be configured to send and receive, or exchange, other types of data, such as image, speech or audio data, or combinations of two or more of video, image, speech and audio data. Accordingly, discussion of video applications is provided for purposes of illustration and should not be considered limiting of the various aspects of the disclosure as broadly described herein.

Video source 18 may include a video capture device, such as one or more video cameras, a video archive containing previously captured video, or a live video feed from a video content provider. As a further alternative, video source 18 may generate computer graphics-based data as the source video (e.g., for gaming or virtual reality), or a combination of live video and computer-generated video. In some cases, if video source 18 is a camera, source device 12 and receive device 14 may form so-called camera phones or video phones. Hence, in some aspects, source device 12, receive device 14 or both may form a wireless communication device handset, such as a mobile telephone. In each case, the captured, pre-captured or computer-generated video may be encoded by video encoder 20 for transmission from video source device 12 to video decoder 26 of video receive device 14 via transmitter 22, channel 16 and receiver 24. Display device 28 may include any of a variety of display devices such as a liquid crystal display (LCD), plasma display or organic light emitting diode (OLED) display.

Video encoder 20 and video decoder 26 may be configured to support scalable video coding for spatial, temporal and/or signal-to-noise ratio (SNR) scalability. In some aspects, video encoder 20 and video decoder 22 may be configured to support fine granularity SNR scalability (FGS) coding. Encoder 20 and decoder 26 may support various degrees of scalability by supporting encoding, transmission and decoding of a base layer and one or more scalable enhancement layers. For scalable video coding, a base layer carries video data with a minimum level of quality. One or more enhancement layers carry additional bitstream to support higher spatial, temporal and/or SNR levels.

Video encoder 20 and video decoder 26 may operate according to a video compression standard, such as MPEG-2, MPEG-4, ITU-T H.263, ITU-T H.264/MPEG-4 Advanced Video Coding (AVC), or a revised standard proposed by the Joint Collaborative Team-Video Coding (JCT-VC), which is a collaboration between MPEG and ITU-T, that may be referred to as High Efficiency Video Coding (HEVC). Although not shown in FIG. 1, video encoder 20 and video decoder 26 each may be implemented as one or more microprocessors, digital signal processors (DSPs), application specific integrated circuits (ASICs), field programmable gate arrays (FPGAs), discrete logic, software, hardware, firmware or any combinations thereof. Hence, each of video encoder 20 and video decoder 26 may be implemented as least partially as an integrated circuit (IC) chip or device, and included in one or more encoders or decoders, either of which may be integrated as part of a combined encoder/decoder (CODEC) in a respective mobile device, subscriber device, broadcast device, server, or the like. In addition, source device 12 and receive device 14 each may include appropriate modulation, demodulation, frequency conversion, filtering, and amplifier components for transmission and reception of encoded video, as applicable, including radio frequency (RF) wireless components and antennas sufficient to support wireless communication. For ease of illustration, however, such components are not shown in FIG. 1.

A video sequence includes a series of video frames. Video encoder 20 operates on blocks of pixels within individual video frames in order to encode the video data. The video blocks may have fixed or varying sizes, and may differ in size according to a specified coding standard. Each video frame includes a series of slices. Each slice may include a series of macroblocks, which may be arranged into sub-blocks. As an example, the ITU-T H.264 standard supports intra prediction in various block sizes, such as 16 by 16, 8 by 8, 4 by 4 for luma components, and 8×8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

Smaller video blocks can provide better resolution, and may be used for locations of a video frame that include higher levels of detail. In general, macroblocks (MBs) and the various sub-blocks may be considered, in general, to represent video blocks. In addition, a slice may be considered to represent a series of video blocks, such as MBs and/or sub-blocks. Each slice may be an independently decodable unit. After prediction, a transform may be performed on the 8×8 residual block or 4×4 residual block, and an additional transform may be applied to the DCT coefficients of the 4×4 blocks for chroma components or luma component if the intra_16× 16 prediction mode is used.

Video encoder 20 and/or video decoder 26 of system 10 of FIG. 1 may be configured to employ the coding techniques described in this disclosure. In particular, video encoder 20 and/or video decoder 26 may each include a lossless statistical coding unit, which is commonly referred to as an "entropy coding unit" (which itself may be referred to as an entropy encoder) and "an entropy decoding unit" (which itself may be referred to as an entropy decoder), respectively, that implements at least some of such techniques to promote more efficient coding, reduced complexity and power conservation.

To implement these coding techniques, a coding device, such as video encoder 20 and more particularly the entropy encoder of video encoder 20, first receives data defining sets of values. In the examples discussed herein, these sets of values are distributed according to either a geometric or double geometric distribution. These sets of values may be referred to as a sample, as is customary in the area of information theory. A sample in this instance may refer to any type of data, including data corresponding to the wide variety of applications described above, such as digital video, image, audio or speech data. With respect to digital video data, a sample or set of values may, as one example, refer to quantized data indicative of pixel values in a block or residual block. For example, the samples may be indicative of Discrete Cosine Transform (DCT) coefficients of a residual block. In other examples, the samples may be indicative of any other suitable video data such as video syntactic elements. Each value of the set of values may be referred to as a symbol, as is customary in the area of information theory.

After receiving these sets of values, the entropy encoder of video encoder 20 computes a sum of a first one of the sets of values. That is, for a first sample, the entropy encoder sums together the values of the sample. Next, the entropy encoder determines an index that distinguishes the computed sum of the first one of the sets of values from other sets of values that also have a computed sum that is the same as the computed sum of the first one of the sets of values. The entropy encoder may determine this index by arranging these samples having the same sum in an order of decreasing probability of occurrence and then assigning an index value to each of the samples having the same sum such that the highest probability sample is assigned an index of one and the lowest highest probability sample is assigned an index equal to the total number of samples that have the same sum. This form of grouping may be referred to as "alphabet grouping." Alternatively, the samples could be arranged in an inverse order or any other mathematically determinable order and the indexes may be assigned as described above or any other mathematically determinable way only with respect to the new ordering.

Once these indices are determined, the entropy encoder codes the computed sum using a variable-length code to generate a coded sum and then the determined index using a uniform code to generate a coded index. From the coded sum and the coded index, the entropy encoder of video encoder 20 generates a generalized Golomb code to code the first one of the sets of values. The entropy encoder outputs these Golomb codes via the communication channel to video decoder 26, which performs operations inverse to those described above with respect to video encoder 20. That is, the entropy decoder of video decoder 20 separates the generalized Golomb code into the coded sum and the coded index. The entropy decoder may then decode the coded sum and the coded index to identify the sample. After identifying this sample, the entropy decoder of video decoder 26 outputs this sample for use in the remaining aspects of video decoding, which are described in more detail below.

In any event, rather than perform ordinary Golomb-Rice coding, which involves dividing a given input stream by two to form a quotient and remainder and then coding the quotient using a unary code and the remainder using a Rice code or any other binary coding scheme, the techniques, when implemented by the entropy encoder of video encoder 20, form what may be referred to as generalized Golomb code from a coded index determined using alphabetic grouping and a coded sum. This form of the Golomb code is generalized in that the coding device need not implement any special qualifiers or algorithms to handle or otherwise prevent the application of Golomb-Rice codes to code values in a stream of data that otherwise, due to the nature of the distribution of such values in the stream, would result in coding inefficiencies. Instead, the techniques enable a modified form of Golomb coding that is capable of coding values in a stream of data that are distributed in a way that can be approximated by a geometric or double geometric statistical distribution despite how these distributions are fit to the values in the stream of data (or, in other words, regardless of the value of the spread parameter). In this respect, the techniques may improve upon conventional Golomb or Golomb-Rice coding to provide for increased coding efficiency when coding sets of values in a stream of data whose distributions can be approximated by a geometric or double geometric distribution. As no special qualifiers are required to implement this generalized form of Golomb coding, the techniques may reduce implementation complexity. Considering that each operation performed by a coding device generally consumes power, the reduced implementation complexity may result in less power consumption, which is particularly beneficial for portable devices, such as a cellular phone or handset, that often rely on a battery to power the device for extended periods of time. In this way, the techniques not only improve coding efficiency for the samples having values distributed in accordance with a geometric or double-geometric distribution but also reduce implementation complexity by avoiding qualifiers, which reduces power consumption.

Figure 2:
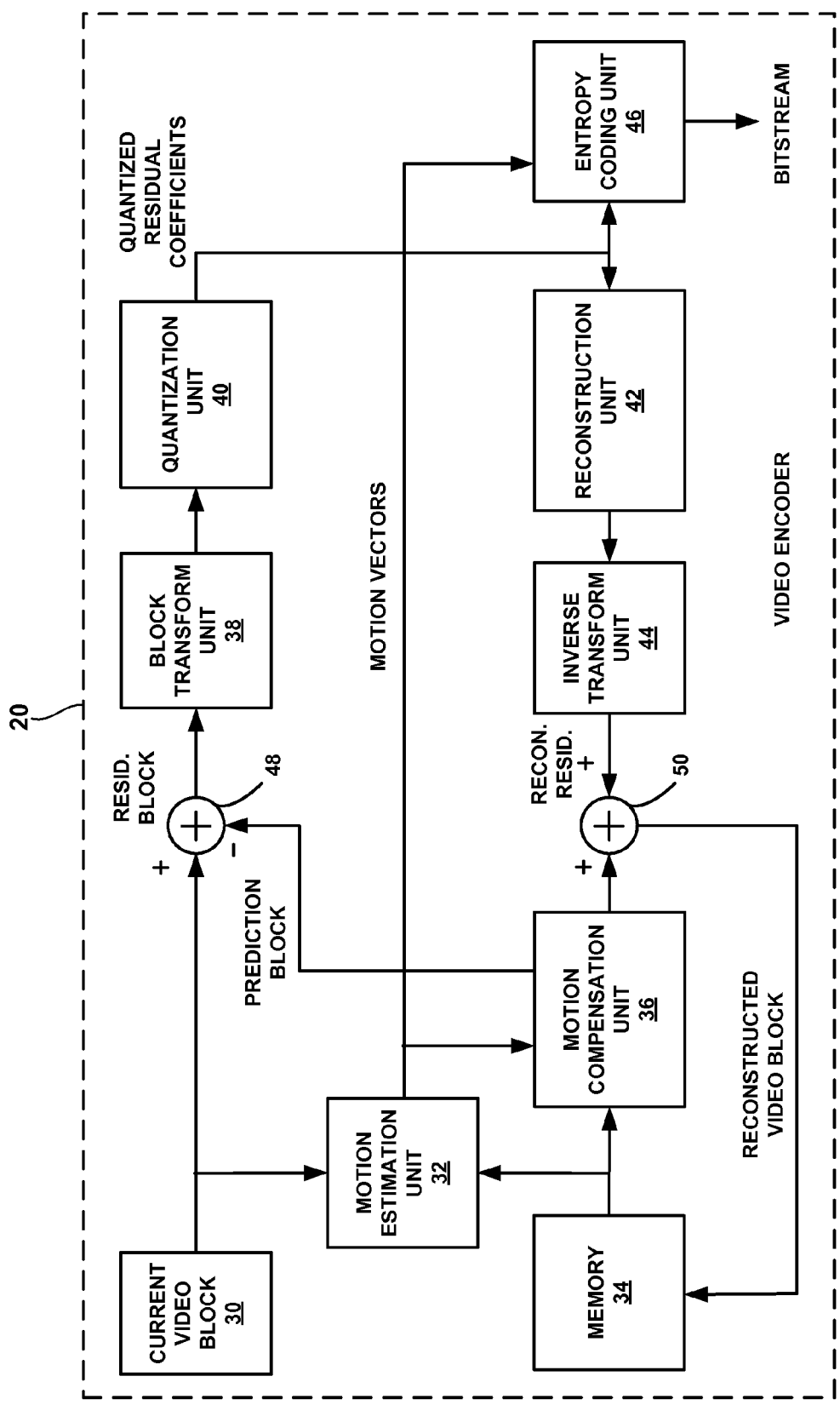
FIG. 2 is a block diagram illustrating an example of a video encoder as shown in FIG. 1.

FIG. 2 is a block diagram illustrating an example of a video encoder 20 as shown in FIG. 1. Video encoder 20 may be formed at least in part as one or more integrated circuit devices, which may be referred to collectively as an integrated circuit device. In some aspects, video encoder 20 may form part of a wireless communication device handset or broadcast server. Video encoder 20 may perform intra- and inter-coding of blocks within video frames. Intra-coding relies on spatial prediction to reduce or remove spatial redundancy in video within a given video frame. Inter-coding relies on temporal prediction to reduce or remove temporal redundancy in video within adjacent frames of a video sequence. For inter-coding, video encoder 20 performs motion estimation to track the movement of matching video blocks between adjacent frames.

As shown in FIG. 2, video encoder 20 receives a current video block 30 within a video frame to be encoded. In the example of FIG. 2, video encoder 20 includes motion estimation unit 32, memory 34, motion compensation unit 36, block transform unit 38, quantization unit 40, inverse quantization unit 42, inverse transform unit 44 and entropy coding unit 46. An in-loop or post loop deblocking filter (not shown) may be applied to filter blocks to remove blocking artifacts. Video encoder 20 also includes summer 48 and summer 50. FIG. 2 illustrates the temporal prediction components of video encoder 20 for inter-coding of video blocks. Although not shown in FIG. 2 for ease of illustration, video encoder 20 also may include spatial prediction components for intra-coding of some video blocks.

Motion estimation unit 32 compares video block 30 to blocks in one or more adjacent video frames to generate one or more motion vectors. The adjacent frame or frames may be retrieved from memory 34, which may represent any type of memory or data storage device to store video blocks reconstructed from previously encoded blocks. Motion estimation may be performed for blocks of variable sizes, e.g., 16×16, 16×8, 8×16, 8×8 or smaller block sizes. Motion estimation unit 32 identifies one or more blocks in adjacent frames that most closely matches the current video block 30, e.g., based on a rate distortion model, and determines displacement between the blocks in adjacent frames and the current video block. On this basis, motion estimation unit 32 produces one or more motion vectors (MV) that indicate the magnitude and trajectory of the displacement between current video block 30 and one or more matching blocks from the reference frames used to code current video block 30.

Motion vectors may have half- or quarter-pixel precision, or even finer precision, allowing video encoder 20 to track motion with higher precision than integer pixel locations and obtain a better prediction block. When motion vectors with fractional pixel values are used, interpolation operations are carried out in motion compensation unit 36. Motion estimation unit 32 identifies the best block partitions and motion vector or motion vectors for a video block using certain criteria, such as a rate-distortion model. For example, there may be more than one motion vector in the case of bi-directional prediction. Using the resulting block partitions and motion vectors, motion compensation unit 36 forms a prediction video block.

Video encoder 20 then forms a residual video block by subtracting the prediction video block produced by motion compensation unit 36 from the original, current video block 30 at summer 48. Block transform unit 38 applies a transform, such as the 4×4 or 8×8 integer transform used in H.264/AVC, to the residual block, producing residual transform block coefficients.

Quantization unit 40 quantizes (e.g., rounds) the residual transform block coefficients to further reduce bit rate. Quantization unit 40 may also perform the reordering mentioned above whereby quantization unit 40 may reorder various portions of the residual transform block coefficients. For example, the transform coefficients may comprise DCT coefficients that include at least one DC coefficient and one or more AC coefficients. Quantization unit 40 may group DC coefficients from one or more residual transform block coefficients to form a single sample and group the one or more AC coefficients from one or more residual transform block coefficients to form one or more samples. Thus, quantization unit 40 may reorder the DCT coefficients to form samples that comprise only DC coefficients from one or more blocks and AC coefficients from one or more blocks.

Entropy coding unit 46 entropy codes the quantized coefficients to even further reduce bit rate. Entropy coding unit 46 may code the quantized block coefficients in accordance with the coding techniques described in this disclosure. Hence, the various encoding processes described in this disclosure may be implemented within entropy coding unit 46 to perform coding of video data. Alternatively, such an entropy coding unit 46 may perform the processes described in this disclosure to code any of a variety of data, including but not limited to video, image, speech and audio data. In general, video decoder 26 performs inverse operations to decode and reconstruct the encoded video, as will be described, e.g., with reference to FIG. 4.

Reconstruction unit 42 and inverse transform unit 44 reconstruct quantized coefficients and apply inverse transformation, respectively, to reconstruct the residual block. Summation unit 50 adds the reconstructed residual block to the motion compensated prediction block produced by motion compensation unit 36 to produce a reconstructed video block for storage in memory 34. The reconstructed video block is used by motion estimation unit 32 and motion compensation unit 36 to encode a block in a subsequent video frame.

Figure 3:
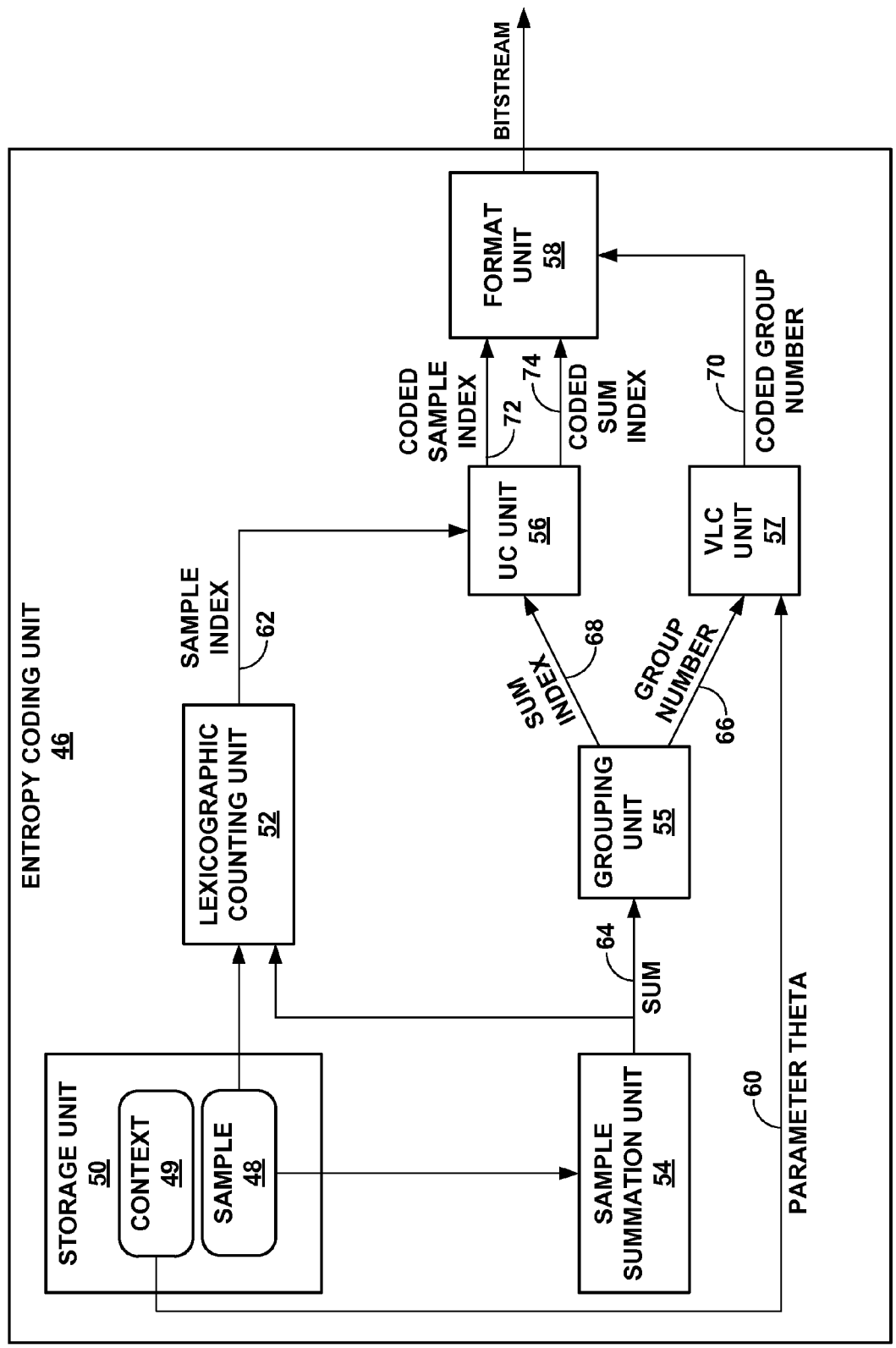
FIG. 3 is a block diagram illustrating an example of a lossless coding unit in more detail.

FIG. 3 is a block diagram illustrating an example of a lossless coding unit, such as entropy coding unit 46 of FIG. 2, in more detail. As shown in FIG. 3, entropy coding unit 46 receives a sample 48 to be encoded. In the example of FIG. 3, entropy coding unit 46 includes storage unit 50, a lexicographic counting unit 52, a sample summation unit 54, a grouping unit 55, a uniform coding (UC) unit 56 ("UC unit 56"), a variable length coding (VLC) unit 57 ("VLC unit 57") and a format unit 58, each of which may be implemented in hardware or a combination of hardware and software modules. Although not shown in FIG. 3, entropy coding unit 46 may include other modules for encoding the other information described above, such as a motion vector coding unit. The techniques therefore should not be limited to the example entropy coding unit 46 shown in FIG. 3.

Entropy coding unit 46 receives sample 48, which as described above may comprise quantized DCT coefficients, and stores sample 48 to storage unit 50. Entropy coding unit 46 also stores a context 49 to storage unit 50, which entropy coding unit 46 may determine itself or receive from another module or unit of video encoder 20. Context 49 may include spread parameter theta 60 that is used to fit either a geometric or double geometric statistical distribution to video data that includes sample 48. Storage unit 50 may comprise a computer-readable storage medium, such as a random access memory (RAM), synchronous dynamic random access memory (SDRAM), read-only memory (ROM), non-volatile random access memory (NVRAM), electrically erasable programmable read-only memory (EEPROM), FLASH memory, magnetic or optical data storage media, any other type of memory or storage device capable of storing sample 48, or any combination of the foregoing memories or storage devices. While described as residing internally to entropy coding unit 46, storage unit 50 may reside externally from entropy coding unit 46, with entropy coding unit 46 accessing storage unit 50 to retrieve sample 48.

Lexicographic counting unit 52 may access storage unit 50 to retrieve sample 48. Lexicographic counting unit 52 may perform a form of lexicographic counting that orders variations of samples having the same sum as determined by sample summation unit 54 and assigns an index to each of these variations. Samples need to be ordered in this manner as the individual values that form the samples may be different from one another despite that these samples sum to the same value. To illustrate, consider a first sample comprising four values of (1, 1, 1, 1) and a second sample comprising four values of (2, 0, 1, 1). Both of the set of four values of the first and second samples sums to four. To distinguish the first samples from the second sample, lexicographic counting unit 52 defines an ordering of samples that sum to the same value such that, with respect to the example above, the set of four values (0, 0, 0, 4) is assigned an index of zero, the set of four values (0, 0, 1, 3) is assigned an index of one, the set of four values (0, 0, 2, 2) is assigned in index of two, the set of four values (0, 0, 3, 1) is assigned an index of three, . . . , the set of four values (4, 0, 0, 0) is assigned the last index. Using this form of lexicographic counting, lexicographic counting unit 52 determines a sample index 62 for sample 48.

Meanwhile, sample summation unit 54 accesses storage unit 50 and retrieves sample 48, whereupon sample summation unit 54 sums the set of values that form sample 48. For example, consider the above first sample having a set of values of (1, 1, 1, 1). Sample summation unit 54 sums this set of samples to produce a sum 64 of four. Sample summation unit 54 generates a sum 64 for sample 48 and transmits this sum 64 to grouping unit 55.

Grouping unit 55 implements a form of grouping referred to as alphabetic grouping, as one example. When performing alphabetic grouping, grouping unit 55 sorts sums 64 into groups. Depending on the occurrence of each one of sums 64 in the stream of data, grouping unit 55 then orders sums 64 within each group in accordance to their probability of occurrence. Once ordered in this manner, grouping unit 55 assigns an index of zero to one of sums 64 in any given group with the highest probability of occurrence in the stream of data, an index of one to the second one of sums 64 in any given group with the second highest probability of occurrence in the stream of data and so on. For example, grouping unit 55 may determine groups such that some of the groups only have a single one of sums, while other groups have multiple sums 64 that are different values. Grouping unit 55 orders these sums within the groups according to their probability of occurrence so that sums assigned to the same group may be differentiated from one another using the sum index. In some instances, grouping unit 55 may dynamically determine this ordering in near real-time as it processes samples. In this way, grouping unit 55 outputs a group number 66 identifying a group to which sum 64 has been assigned and a sum index 68 identifying an index of sum 64 within the group identified by group number 66.

VLC unit 57 implements one or more forms of VLC, such as Huffman coding, to code group number 66. In VLC, the symbol, which in this case is group number 66, with the highest probability of occurrence in a data stream is assigned the shortest codeword, while the symbol with the lowest probability of occurrence in a data stream is assigned the longest codeword. In this manner, on average, VLC compresses data by replacing high probability symbols with codewords that are most likely shorter in terms of bits used to define the symbol than the length of the symbols themselves. Once coded in this manner, VLC unit 57 outputs a coded group number 70.

UC unit 56 receives both sample index 62 and sum index 68, both of which it codes independently using uniform codes. In UC, each code is the same length, hence the name uniform codes. UC is often employed when the distribution of symbols is relatively flat, meaning that there is an equal probability of occurrence of the symbol. UC unit 56 processes each of sample index 62 and sum index 68 in accordance with conventional uniform coding techniques to output a coded sample index 72 and a coded sum index 74. Format unit 58 formats coded sample index 72, coded sum index 74 and coded group number 70 to form the bitstream. Often, standards define a certain format for bitstreams. Format unit 58 adheres to one or more of these standard-defined formats and may reorder or otherwise rearrange, edit, tag or modify this data to form the bitstream, which is output to video decoder 26.

Figure 4:
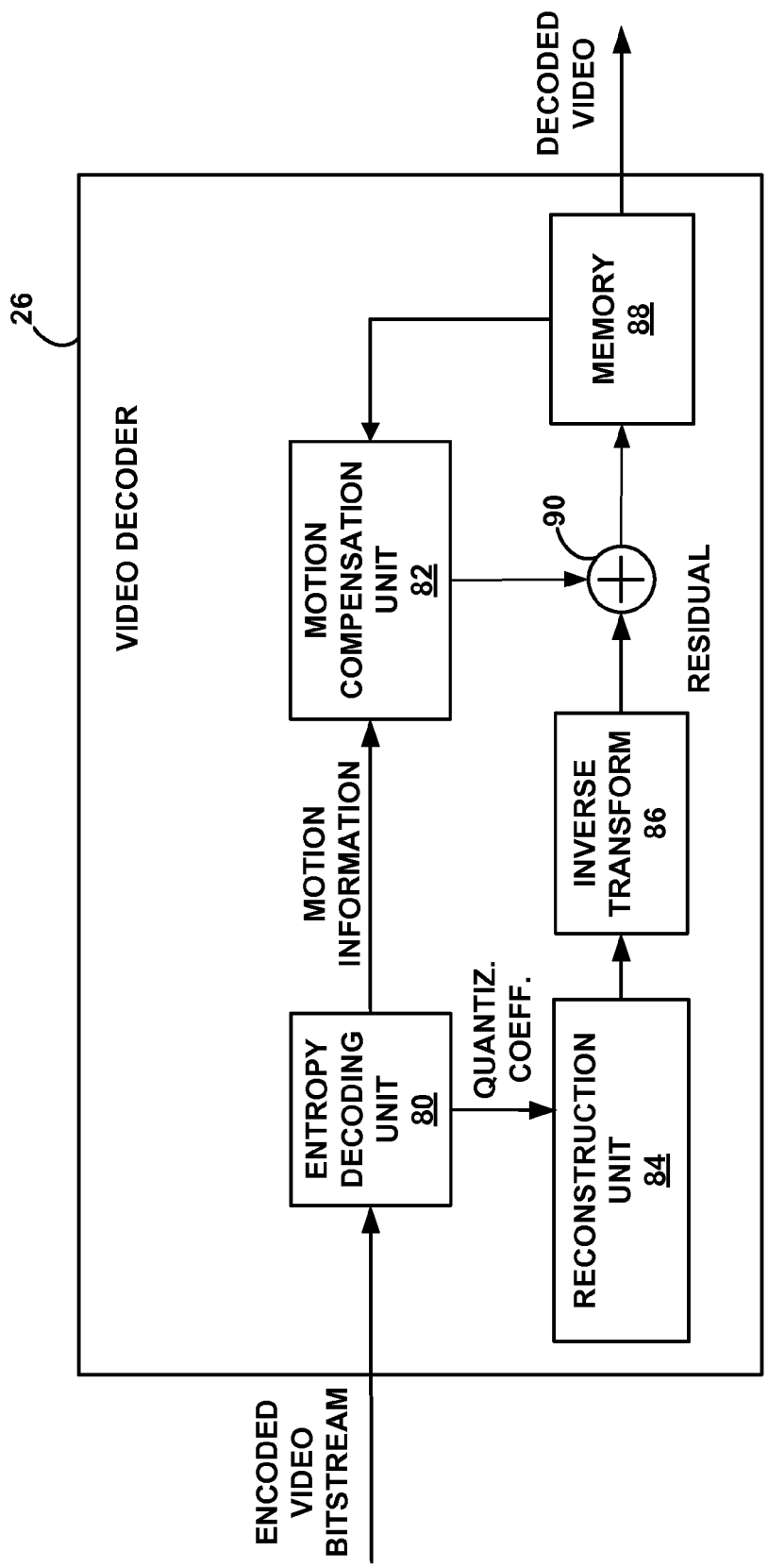
FIG. 4 is a block diagram illustrating an example of the video decoder of FIG. 1.

FIG. 4 is a block diagram illustrating an example of video decoder 26 of FIG. 1. Video decoder 26 may be formed at least in part as one or more integrated circuit devices, which may be referred to collectively as an integrated circuit device. In some aspects, video decoder 26 may form part of a wireless communication device handset. Video decoder 26 may perform intra- and inter-decoding of blocks within video frames. As shown in FIG. 1, video decoder 26 receives an encoded video bitstream that has been encoded by video encoder 20. In the example of FIG. 4 video decoder 26 includes entropy decoding unit 80, motion compensation unit 82, reconstruction unit 84, inverse transform unit 86, and memory 88. Video decoder 26 also may include an in-loop deblocking filter (not shown) that filters the output of summer 90. Video decoder 26 also includes summer 90. FIG. 4 illustrates the temporal prediction components of video decoder 26 for inter-decoding of video blocks. Although not shown in FIG. 4, video decoder 26 also may include spatial prediction components for intra-decoding of some video blocks.

Entropy decoding unit 80 receives the encoded video bitstream and decodes from the bitstream quantized residual coefficients and quantized parameters, as well as other information, such as macroblock coding mode and motion information, which may include motion vectors and block partitions. For example, in order to decode quantized parameters and sample from the encoded bitstream, like entropy coding unit 46 of FIG. 3, entropy decoding unit 80 of FIG. 4 may perform the inverse of the coding techniques described with respect to entropy coding unit 46 of FIG. 3 in order to retrieve the sample from the encoded bitstream. Hence, the various decoding processes described in this disclosure may be implemented within entropy decoding unit 80 to perform decoding of video data. Alternatively, entropy decoding unit 80 may perform the processes described in this disclosure to decode any of a variety of data, including but not limited to video, image, speech and audio data. For example, the data being decoded may include pixel data, video format syntactic elements, or other coded video data. In either case, the result of the coding performed by entropy decoding unit 80 may be output to a user, stored in memory and/or transmitted to another device or processing unit.

Motion compensation unit 82 receives the motion vectors and block partitions and one or more reconstructed reference frames from memory 88 to produce a prediction video block. Reconstruction unit 84 inverse quantizes, i.e., de-quantizes, the quantized block coefficients. Inverse transform unit 86 applies an inverse transform, e.g., an inverse DCT or an inverse 4×4 or 8×8 integer transform, to the coefficients to produce residual blocks. The prediction video blocks are then summed by summer 90 with the residual blocks to form decoded blocks. A deblocking filter (not shown) may be applied to filter the decoded blocks to remove blocking artifacts. The filtered blocks are then placed in memory 88, which provides reference frame for decoding of subsequent video frames and also produces decoded video to drive display device 28 (FIG. 1).

Figure 5:
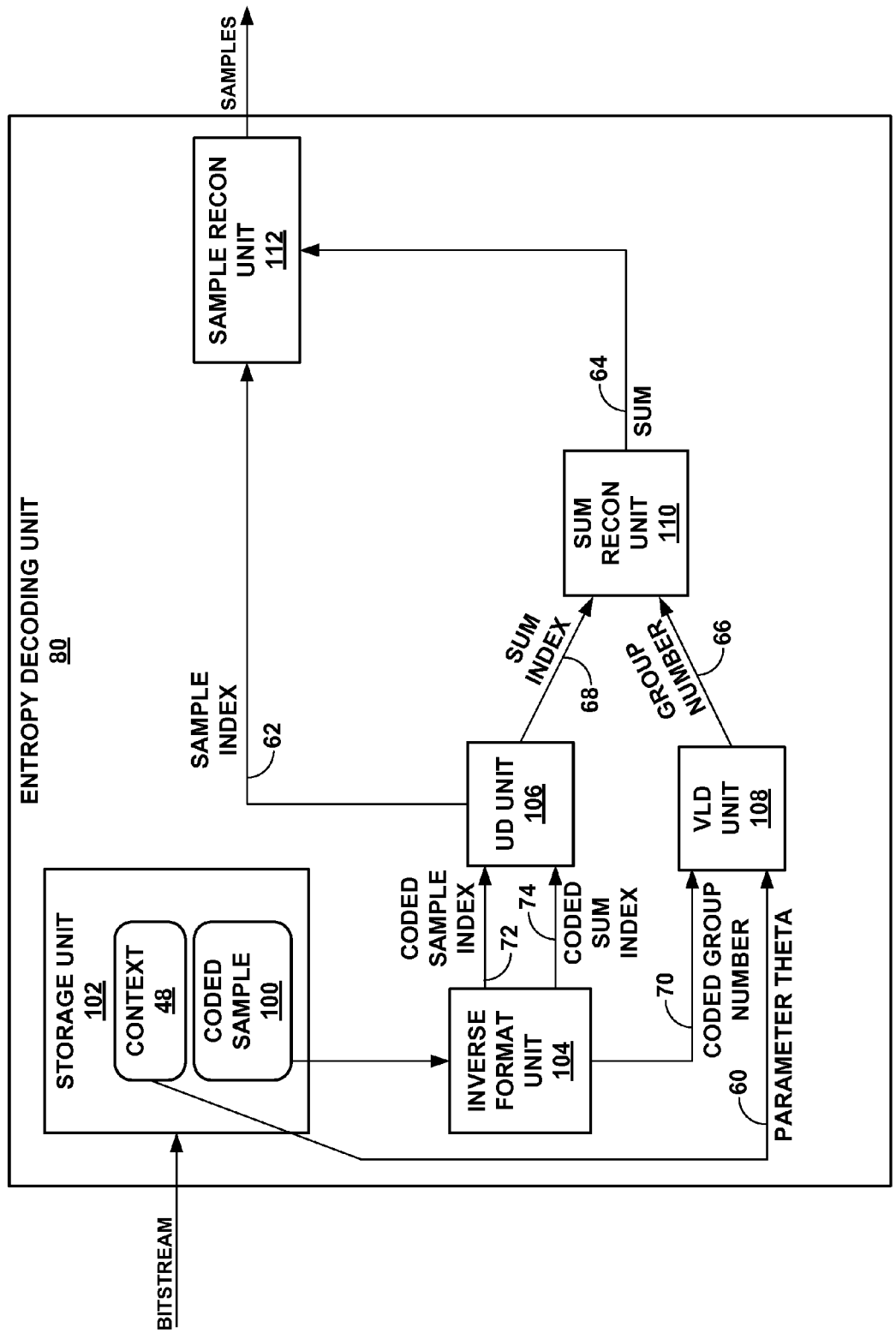
FIG. 5 is a block diagram illustrating an example of a lossless decoding unit in more detail.

FIG. 5 is a block diagram illustrating an example of a lossless decoding unit, such as entropy decoding unit 80 of FIG. 4, in more detail. As shown in the example of FIG. 5, entropy decoding unit 80 receives a bitstream that includes an encoded sample 100. In the example of FIG. 5, entropy decoding unit 80 includes storage unit 102, an inverse format unit 104, an uniform decoding (UD) unit 106 ("UD decoding unit 106), a variable length decoding (VLD) unit 108 ("VLD unit 108"), a sum reconstruction unit 110 ("sum recon unit 110"), and a sample reconstruction unit 112 ("sample recon unit 112"), each of which may be implemented as one or more hardware modules or a combination of one or more hardware and software modules. Although not shown in FIG. 5, entropy decoding unit 80 may include other modules for encoding the other information described above, such as a motion vector decoding unit. The techniques of this disclosure, therefore, should not be limited to the example of entropy decoding unit 80 shown in FIG. 5.

Entropy decoding unit 80 receives coded sample 100, which as described above may comprise of coded quantized DCT coefficients, and stores coded sample 100 to storage unit 102. Storage unit 102 may be substantially similar to storage unit 50 in that storage unit 102 comprises a computer-readable storage medium, such as a such as random access memory (RAM), synchronous dynamic random access memory (SDRAM), read-only memory (ROM), non-volatile random access memory (NVRAM), electrically erasable programmable read-only memory (EEPROM), FLASH memory, magnetic or optical data storage media, any other type of memory or storage device capable of storing coded sample 100, or any combination of the foregoing memories or storage devices.

While described as residing internally to entropy decoding unit 80, storage unit 102 may reside externally from entropy coding unit 80, with entropy decoding unit 80 accessing storage unit 102 to retrieve coded sample 100, which may comprise a generalized Golomb code coded in accordance with the coding techniques described in this disclosure. Inverse format unit 104 accesses storage unit 102 to retrieve coded sample 100, which it then un-formats to output coded sample index 72, coded sum index 74 and coded group number 70. UD unit 106 receives coded sample index 72 and coded sum index 74 and performs an inverse form of uniform coding to output sample index 62 and sum index 68. VLD unit 108, meanwhile, receives coded group number 70 and performs an inverse form of variable length coding, e.g., inverse Huffman coding, to output group number 66. Based on group number 66 and sum index 68, sum reconstruction unit 110 reconstructs sum 64 by performing operations inverse to those performed by grouping unit 55. Sum reconstruction unit 110 outputs sum 64 to sample reconstruction unit 112, which also receives sample index 62.

Based on sample index 62 and sum 64, sample reconstruction unit 112 performs operations inverse to those performed by lexicographic counting unit 52. Sample reconstruction unit 112 requires sum 64 when lexicographic counting unit 52 may not because lexicographic counting unit 52 may compute sum 64 from sample 48, while sum 64 cannot be directly computed from coded sample 100, but instead involves significant decoding to compute. Consequently, sample reconstruction unit 112 may require sum 64 to properly select a table by which to decode sample index 62 and output sample 48. That is, lexicographic counting unit 52 needs to determine the sum of sample 48 so that it can properly determine an index with respect to those samples having the same sum. In entropy decoding unit 80, this sum must be computed from coded sample 100 and cannot be arrived at merely by summing values defined by coded sample 100. For this reason, sum reconstruction unit 110 provides sum 64 to sample reconstruction unit 112.

Figure 6:
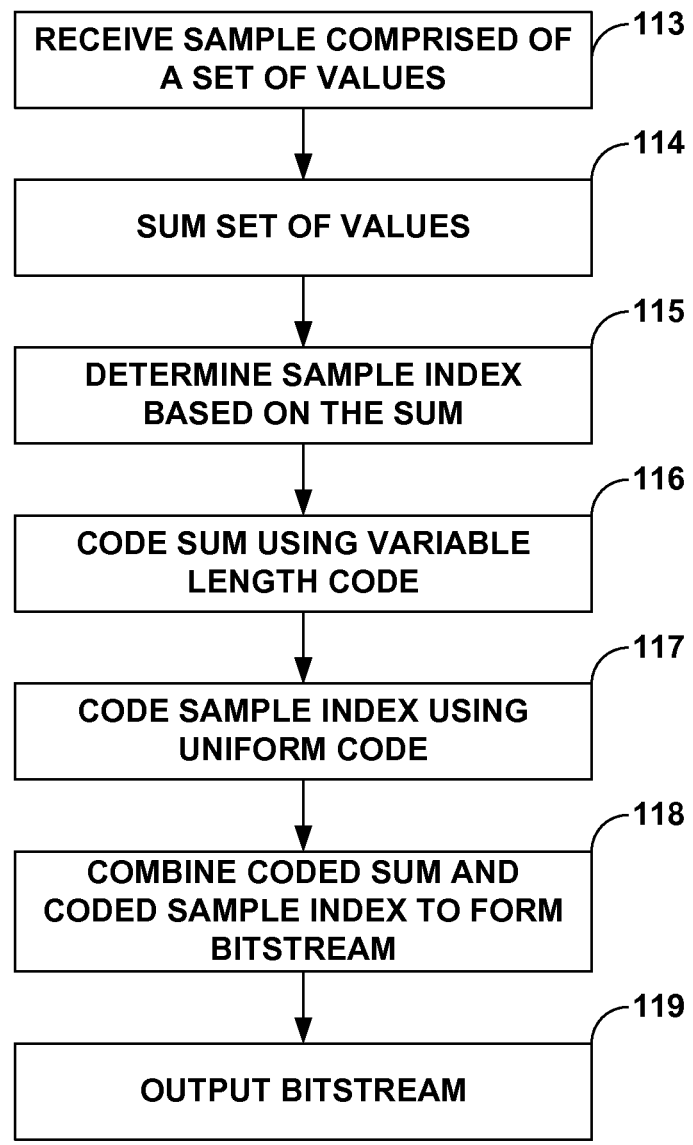
FIG. 6 is a flowchart illustrating exemplary operation of a coding device in performing the coding techniques described in this disclosure.

FIG. 6 is a flowchart illustrating exemplary operation of a coding device, such as entropy coding unit 46 of FIG. 3, in performing the coding techniques described in this disclosure. Initially, entropy coding unit 46 receives sample 48 comprised of a set of values, which as described above may comprise quantized DCT coefficients or any other set of values (113). Sample summation unit 54 then sums the set of values that form sample 48, as described above (114). Lexicographic counting unit 52 then determines the sample index based on the computed sum, as described above (115). In this manner, lexicographic counting unit 52 determines a sample index 62 that uniquely identifies sample 48 in a set of all possible samples having a same length as that of sample 46 and that sum to the same sum, i.e., sum 64 in this example, as that of the values of samples 48. Next, VLC unit 57 codes sum 64 using a variable length code, as described above (116). Meanwhile, UC unit 56 codes sample index 62 using a uniform code, where the uniform code includes either a fixed length code or a code in which the difference between code lengths is at most one (117). Format unit 46 then combines coded sample with the coded sum in the manner described above to form a bitstream (118). Format unit 46 outputs the bitstream (119).

Figure 7:
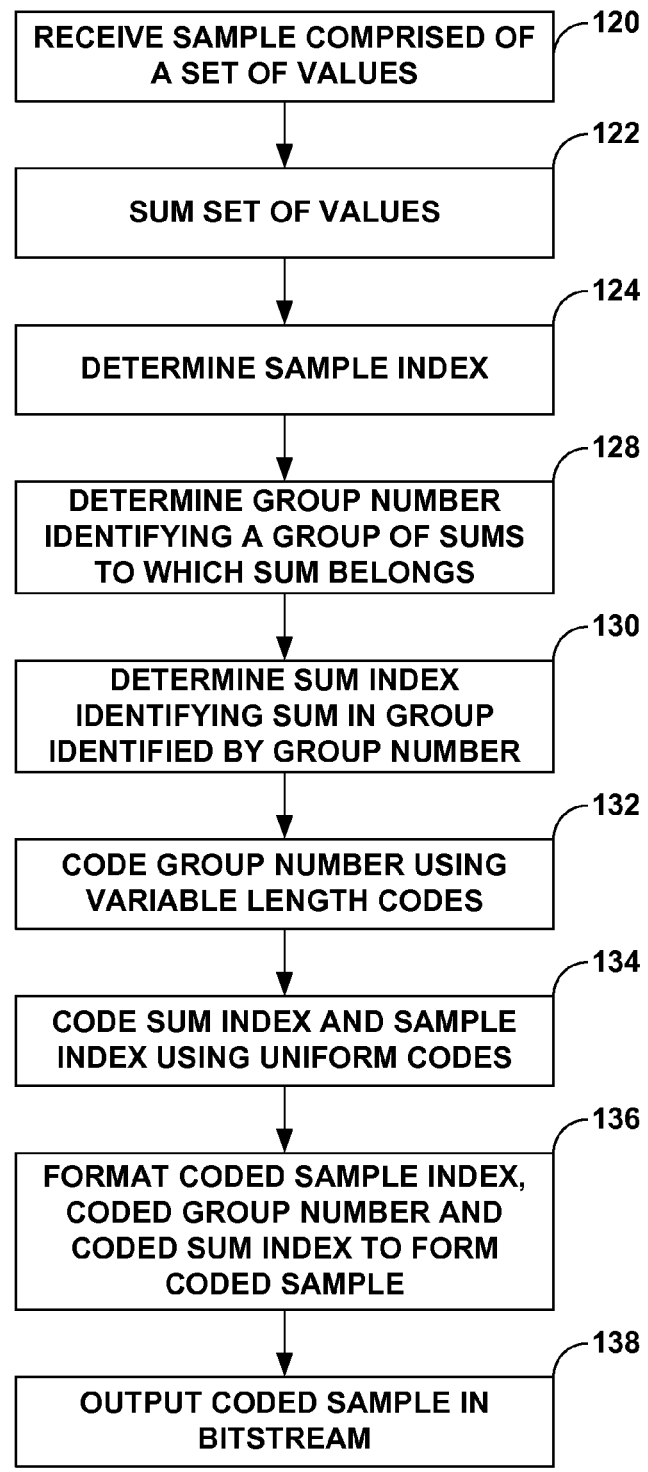
FIG. 7 is a flowchart illustrating exemplary operation of a coding device in performing the coding techniques described in this disclosure in more detail.

FIG. 7 is a flowchart illustrating exemplary operation of a coding device, such as entropy coding unit 46 of FIG. 3, in performing the coding techniques described in this disclosure in more detail. Initially, entropy coding unit 46 receives sample 48, which as described above may comprise quantized DCT coefficients or any other set of values (120). Entropy coding unit 46 then stores sample 48 to storage unit 50. Entropy coding unit 46 also stores a context 49 to storage unit 50, which entropy coding unit 46 may determine itself or receive from another module or unit of video encoder 20. Context 49 may include spread parameter theta 60 that is used to fit either a geometric or double geometric statistical distribution to video data that includes sample 48.

Sample summation unit 54 accesses storage unit 50 and retrieves sample 48, whereupon sample summation unit 54 sums the set of values that form sample 48 (122). Sample summation unit 54 generates a sum 64 for sample 48 and transmits this sum 64 to grouping unit 55 and lexicographic counting unit 52. Lexicographic counting unit 52 then performs a form of lexicographic counting that orders variations of samples having the same sum, i.e., sum 64 in this instance as computed by sample summation unit 54, and assigns an index to each of these variations, as described above. Using this form of lexicographic counting as described above, lexicographic counting unit 52 determines a sample index 62 for sample 48 (124). In this manner, lexicographic counting unit 52 determines a sample index 62 that uniquely identifies sample 48 in a set of all possible samples having a same length as that of sample 46 and that sum to the same sum, i.e., sum 64 in this example, as that of the values of samples 48.

Grouping unit 55 implements a form of grouping referred to as alphabetic grouping and, when performing alphabetic grouping, grouping unit 55 sorts sums 64 into groups. Depending on the occurrence of each one of sums 64 in the stream of data, grouping unit 55 then orders sums 64 within each group in accordance to their probability of occurrence. Once ordered in this manner, grouping unit 55 assigns an index of zero to one of sums 64 in any given group with the highest probability of occurrence in the stream of data, an index of one to the second one of sums 64 in any given group with the second highest probability of occurrence in the stream of data and so on. In this manner, grouping unit 55 determines a group number 66 identifying a group to which sum 64 has been assigned and a sum index 68 identifying an index of sum 64 within the group identified by group number 66 (128, 130).

VLC unit 57 implements one or more forms of VLC, such as Huffman coding, to code group number 66 using variable length codes as set forth by way of example above (132). Once coded in this manner, VLC unit 57 outputs a coded group number 70. UC unit 56 receives both sample index 62 and sum index 68, both of which it codes independently using uniform codes (134), as described in more detail above. Format unit 58 formats coded sample index 72, coded sum index 74 and coded group number 70 to form a coded sample (136). Format unit 58 outputs this coded sample in the bitstream (138).

Mathematically, the generalized Golomb code may be designed or formulated through analysis of the following equations. As noted above, conventional Golomb or the special case of Golomb codes, referred to as Golomb-Rice codes, may experience compression inefficiencies as measured by the metric referred to as redundancy. To improve compression efficiency, a generalized Golomb code is constructed for n-tuples of input values $i_1, \ldots, i_n$, where n is greater than two. That is, the set of values includes more than two values. This n-tuple may be referred to as a block and the resulting code may be referred to as a generalized Golomb block code or a block code. Assuming an identical geometric model for each input, the probability of any given block can be expressed by the following equation (1):

$$Pr(i_1, \ldots, i_n) = \prod_{j=1}^{n} Pr(i_j) = (1-\theta)^n \theta^\Sigma, \qquad (1)$$

wherein $\Sigma$ denotes the sum of all block values per the following equation (2):

$$\Sigma = \Sigma(i_1, \ldots, i_n) = \sum_{j=1}^{n} i_j. \qquad (2)$$

From equation (1) and (2), it is apparent that the probability of a block is actually a function of the sum $\Sigma$ and, therefore, it is reasonable to conclude that there are many possible input blocks with the same probability.

The exact number of all possible blocks with the same sum or $\Sigma$ is given by the following equation (3), which involves a so-called multiset coefficient (as denoted by the double parenthesis:

$$\left(\!\!\binom{n}{\Sigma}\!\!\right) = \binom{\Sigma + n - 1}{n - 1}. \qquad (3)$$

As shown below in more detail, it is further possible to compute a mapping that associates each block $i_1, \ldots, i_n$ a set of all possible blocks that sum to the same sum $\Sigma$ with a unique index $\xi$, as shown by the following equation (4):

$$\xi : \left\{[i_1, \ldots, i_n] : i_j \geq 0, \sum_j i_j = \Sigma\right\} \leftrightarrow \left\{0, 1, \ldots, \left(\!\!\binom{n}{\Sigma}\!\!\right) - 1\right\}. \qquad (4)$$

Reviewing these equations, it follows that a code for a block $i_1, \ldots, i_n$ can be designed using two parts. The first part involves a variable length code for the sum $\Sigma$ and the second part involves a uniform code for an index of an input block $\xi(i_1, \ldots, i_n)$ in a set of block that all sum to the same sum $\Sigma$.

In this example, $\Sigma$ is coded using a variable length code. To code the sum $\Sigma$ using this variable length code, the spread parameter $\theta$ used to fit a geometric or double geometric distribution may be required to efficiently code $\Sigma$. The following equations (5) and (6) set forth the equations for geometric and double geometric distributions respectively:

$$Pr(i) = (1-\theta)\theta^i, i \in \square^+, \theta \in (0, 1), \quad (5)$$

$$Pr(i) = \frac{1-\theta}{1+\theta}\theta^{|i|}, i \in \square, \theta \in (0, 1). \quad (6)$$

When the spread parameter $\theta$ of these distributions is known, the appropriate density that should be assigned for a code that codes $\Sigma$ is the negative Binomial distribution, as expressed by the following equation (7):

$$Pr(\Sigma) = \left(\binom{n}{\Sigma}\right)(1-\theta)^n \theta^\Sigma. \quad (7)$$

This family of negative Binomial distributions is often difficult to code considering that it has an infinite support and, depending on the value of the spread parameter $\theta$, its mean and mode may lie almost anywhere. To overcome this diversity of shapes exhibited by the negative Binomial distribution, alphabet grouping may be applied, which effectively combines adjacent values of sums $\Sigma$ into groups. Once grouped in this manner, all that needs to be communicated to the decoder is the group number and the index of any given sum within the identified group number.

While this alphabet grouping technique is not often difficult in practice to implement, the difficulty typically lies in separating the groups in such a manner that the worst case redundancy (under a known parameter $\theta$) is bounded. However, the problem that arises due to this difficulty can be solved numerically. For example, the following Table 1 illustrates a portioning into groups generated for distributions with parameters n=4 and $\Sigma \in [0, 1081]$.

TABLE 1

Example of partitioning of values of $\Sigma$ into 32 groups (Sigma $\in$ [0, 1081]).

| Group number | Group size | $\Sigma_{min}$ | $\Sigma_{max}$ |
|---|---|---|---|
| 0 | 1 | 0 | 0 |
| 1 | 1 | 1 | 1 |
| 2 | 1 | 2 | 2 |
| 3 | 1 | 3 | 3 |
| 4 | 1 | 4 | 4 |
| 5 | 1 | 5 | 5 |
| 6 | 1 | 6 | 6 |
| 7 | 1 | 7 | 7 |
| 8 | 2 | 8 | 9 |
| 9 | 2 | 10 | 11 |
| 10 | 2 | 12 | 13 |
| 11 | 3 | 14 | 16 |
| 12 | 4 | 17 | 20 |
| 13 | 5 | 21 | 25 |
| 14 | 6 | 26 | 31 |
| 15 | 7 | 32 | 38 |
| 16 | 9 | 39 | 47 |
| 17 | 11 | 48 | 58 |
| 18 | 13 | 59 | 71 |
| 19 | 16 | 72 | 87 |
| 20 | 20 | 88 | 107 |
| 21 | 25 | 108 | 132 |
| 22 | 31 | 131 | 163 |
| 23 | 38 | 164 | 201 |
| 24 | 47 | 202 | 248 |
| 25 | 58 | 249 | 306 |
| 26 | 72 | 307 | 378 |
| 27 | 88 | 379 | 466 |
| 28 | 109 | 467 | 576 |
| 29 | 135 | 576 | 710 |
| 30 | 166 | 711 | 876 |
| 31 | 205 | 877 | 1081 |

In table 1, the number of groups have been reduced to 32 from 1082 different sums. By grouping the sums in this manner, the amount of memory required to store Table 1 is reduced. Moreover, this grouping effectively sets a limit on the maximum code length that can be used by variable length codes.

Using this grouping of sums, such as the grouping shown in the example of Table 1, an array of Huffman code tables may be constructed or determined that vary based on different values of parameter theta, $\theta$. In determining these code tables there is a tradeoff between the number of tables and maintaining redundancy of codes at an acceptable level, where redundancy of a code $\square$, which is one example of the above described redundancy metric, is usually defined by the following equation (8):

$$R(\theta) = \sum_i Pr(i)|\phi(i)| - H(\theta). \quad (8)$$

In equation (8) above, $\square(i)$ denotes a length of an I'th code and $H(\theta)$ represents an entropy of the source and is defined by the following equation (9):

$$H(\theta) = -\sum_i Pr(i) \log Pr(i). \quad (9)$$

In practice, it is also common to consider relative redundancy, which is another example of the above described redundancy metric, as defined by the following equation (10):

$$\rho(\theta) = \frac{R(\theta)}{H(\theta)} \times 100[\%], \quad (10)$$

where relative redundancy $\rho$ indicates what percentage of bits used by the code are redundant.

Returning to Huffman code tables and the tradeoffs between redundancy and the number of tables, consider the following Table 2, which illustrates an instance where relative redundancy is allowed to be no more than 0.5%, resulting in 56 different Huffman code tables:

TABLE 2

Code tables for transmission of parameter Σ (n = 4, theta ∈ [0.2, 0.999]).

| k | $\theta_{min}$ | | | | | | Huffman code lengths for groups of values of Σ | | | | | | | | | |
|---|---|---|---|---|---|---|---|---|---|---|---|---|---|---|---|---|
| 0 | 0.2 | 1 | 2 | 3 | 4 | 5 | 6 | 7 | 8 | 9 | 10 | 11 | 12 | 13 | 14 | 15 | 16 |
| 1 | 0.237 | 2 | 2 | 2 | 3 | 4 | 5 | 6 | 7 | 8 | 9 | 10 | 11 | 12 | 13 | 14 | 15 |
| 2 | 0.343 | 3 | 2 | 2 | 3 | 3 | 4 | 5 | 6 | 7 | 8 | 9 | 10 | 11 | 12 | 13 | 14 |
| 3 | 0.414 | 3 | 3 | 2 | 3 | 3 | 3 | 4 | 5 | 6 | 7 | 8 | 9 | 10 | 11 | 12 | 13 |
| 4 | 0.44 | 3 | 3 | 2 | 3 | 3 | 4 | 4 | 4 | 5 | 6 | 7 | 8 | 9 | 10 | 11 | 12 |
| 5 | 0.448 | 4 | 3 | 2 | 3 | 3 | 3 | 4 | 4 | 5 | 6 | 7 | 8 | 9 | 10 | 11 | 12 |
| 6 | 0.454 | 4 | 3 | 2 | 3 | 3 | 3 | 4 | 5 | 4 | 6 | 7 | 8 | 9 | 10 | 11 | 12 |
| 7 | 0.485 | 4 | 3 | 3 | 3 | 3 | 3 | 3 | 4 | 4 | 5 | 6 | 7 | 8 | 9 | 10 | 11 |
| 8 | 0.542 | 5 | 3 | 3 | 3 | 3 | 3 | 3 | 4 | 4 | 4 | 6 | 7 | 8 | 9 | 10 | 11 |
| 9 | 0.548 | 5 | 4 | 3 | 3 | 3 | 3 | 3 | 4 | 3 | 4 | 6 | 7 | 8 | 9 | 10 | 11 |
| 10 | 0.579 | 6 | 4 | 3 | 3 | 3 | 3 | 3 | 4 | 3 | 4 | 5 | 7 | 8 | 9 | 10 | 11 |
| 11 | 0.584 | 5 | 4 | 3 | 3 | 3 | 3 | 4 | 4 | 3 | 4 | 4 | 6 | 7 | 8 | 9 | 10 |
| 12 | 0.59 | 5 | 4 | 4 | 3 | 3 | 3 | 3 | 4 | 3 | 4 | 4 | 6 | 7 | 8 | 9 | 10 |
| 13 | 0.602 | 6 | 4 | 4 | 3 | 3 | 3 | 3 | 4 | 3 | 4 | 4 | 5 | 7 | 8 | 9 | 10 |
| 14 | 0.625 | 7 | 4 | 4 | 3 | 3 | 3 | 3 | 4 | 3 | 4 | 4 | 5 | 6 | 8 | 9 | 10 |
| 15 | 0.629 | 6 | 5 | 4 | 4 | 3 | 3 | 3 | 4 | 3 | 3 | 4 | 5 | 5 | 7 | 8 | 9 |
| 16 | 0.645 | 6 | 4 | 4 | 4 | 3 | 3 | 4 | 3 | 3 | 3 | 4 | 4 | 5 | 7 | 8 | 9 |
| 17 | 0.646 | 6 | 4 | 4 | 4 | 4 | 3 | 3 | 4 | 3 | 3 | 4 | 4 | 5 | 7 | 8 | 9 |
| 18 | 0.659 | 6 | 5 | 4 | 4 | 4 | 3 | 3 | 4 | 3 | 3 | 4 | 4 | 4 | 7 | 8 | 9 |
| 19 | 0.661 | 7 | 5 | 4 | 4 | 4 | 3 | 3 | 4 | 3 | 3 | 4 | 4 | 4 | 6 | 8 | 9 |
| 20 | 0.68 | 7 | 5 | 4 | 4 | 4 | 4 | 3 | 4 | 3 | 3 | 4 | 4 | 4 | 6 | 8 | 9 |
| 21 | 0.689 | 7 | 5 | 4 | 4 | 4 | 4 | 4 | 3 | 3 | 3 | 3 | 4 | 4 | 6 | 8 | 9 |
| 22 | 0.706 | 7 | 5 | 5 | 4 | 4 | 4 | 4 | 3 | 3 | 3 | 3 | 4 | 5 | 6 | 7 | 8 |
| 23 | 0.737 | 8 | 6 | 5 | 5 | 4 | 4 | 4 | 4 | 3 | 3 | 3 | 3 | 4 | 4 | 5 | 7 |
| 24 | 0.759 | 9 | 7 | 5 | 5 | 5 | 5 | 4 | 4 | 3 | 3 | 3 | 3 | 3 | 4 | 5 | 6 |
| 25 | 0.779 | 9 | 8 | 6 | 6 | 5 | 5 | 5 | 5 | 3 | 3 | 3 | 3 | 3 | 3 | 4 | 6 |
| 26 | 0.8 | 10 | 8 | 7 | 6 | 6 | 5 | 5 | 5 | 3 | 3 | 3 | 3 | 3 | 3 | 4 | 5 |
| 27 | 0.81 | 9 | 8 | 6 | 6 | 6 | 5 | 5 | 5 | 4 | 4 | 3 | 3 | 3 | 3 | 3 | 4 |
| 28 | 0.832 | 10 | 9 | 7 | 6 | 6 | 6 | 6 | 5 | 4 | 4 | 3 | 3 | 3 | 3 | 3 | 4 |
| 29 | 0.843 | 11 | 9 | 8 | 7 | 7 | 6 | 6 | 5 | 4 | 4 | 4 | 3 | 3 | 3 | 3 | 3 |
| 30 | 0.861 | 11 | 9 | 8 | 7 | 7 | 6 | 6 | 6 | 5 | 4 | 4 | 3 | 3 | 3 | 3 | 3 |
| 31 | 0.87 | 12 | 11 | 9 | 8 | 7 | 7 | 6 | 6 | 5 | 4 | 4 | 4 | 3 | 3 | 3 | 3 |
| 32 | 0.883 | 12 | 10 | 9 | 8 | 8 | 7 | 7 | 6 | 5 | 5 | 5 | 4 | 3 | 3 | 3 | 3 |
| 33 | 0.893 | 13 | 11 | 10 | 9 | 9 | 8 | 8 | 7 | 6 | 5 | 5 | 4 | 3 | 3 | 3 | 3 |
| 34 | 0.902 | 13 | 12 | 10 | 9 | 8 | 8 | 7 | 7 | 6 | 5 | 5 | 4 | 4 | 3 | 3 | 3 |
| 35 | 0.91 | 14 | 12 | 11 | 10 | 9 | 9 | 8 | 8 | 7 | 6 | 6 | 5 | 4 | 3 | 3 | 3 |
| 36 | 0.922 | 14 | 12 | 11 | 10 | 10 | 9 | 9 | 8 | 7 | 7 | 6 | 5 | 4 | 4 | 3 | 3 |
| 37 | 0.927 | 15 | 14 | 12 | 11 | 10 | 10 | 9 | 9 | 7 | 7 | 6 | 6 | 5 | 4 | 3 | 3 |
| 38 | 0.935 | 15 | 13 | 12 | 11 | 10 | 10 | 9 | 9 | 8 | 7 | 7 | 6 | 5 | 4 | 4 | 3 |
| 39 | 0.941 | 15 | 14 | 13 | 11 | 11 | 11 | 10 | 10 | 9 | 8 | 8 | 7 | 5 | 5 | 4 | 3 |
| 40 | 0.948 | 16 | 15 | 13 | 12 | 11 | 11 | 11 | 10 | 8 | 8 | 8 | 7 | 6 | 5 | 5 | 4 |
| 41 | 0.956 | 17 | 16 | 15 | 13 | 12 | 12 | 12 | 11 | 9 | 9 | 9 | 8 | 6 | 6 | 5 | 4 |
| 42 | 0.961 | 20 | 19 | 17 | 16 | 15 | 14 | 13 | 13 | 11 | 10 | 10 | 8 | 7 | 7 | 5 | 5 |
| 43 | 0.965 | 19 | 17 | 16 | 15 | 14 | 14 | 13 | 13 | 11 | 10 | 10 | 8 | 7 | 7 | 6 | 5 |
| 44 | 0.971 | 20 | 18 | 17 | 16 | 15 | 15 | 14 | 14 | 12 | 11 | 11 | 9 | 8 | 8 | 6 | 6 |
| 45 | 0.975 | 20 | 19 | 18 | 17 | 16 | 16 | 15 | 15 | 13 | 12 | 12 | 10 | 9 | 9 | 7 | 6 |
| 46 | 0.978 | 20 | 20 | 19 | 17 | 17 | 17 | 16 | 16 | 14 | 13 | 13 | 11 | 10 | 10 | 8 | 7 |
| 47 | 0.982 | 21 | 21 | 20 | 19 | 18 | 17 | 17 | 17 | 15 | 14 | 14 | 12 | 11 | 10 | 10 | 8 |
| 48 | 0.985 | 23 | 23 | 22 | 21 | 20 | 19 | 19 | 19 | 17 | 16 | 15 | 14 | 13 | 12 | 10 | 9 |
| 49 | 0.988 | 23 | 23 | 22 | 21 | 20 | 19 | 19 | 19 | 17 | 16 | 15 | 14 | 13 | 12 | 11 | 10 |
| 50 | 0.99 | 24 | 24 | 23 | 22 | 21 | 20 | 20 | 20 | 18 | 17 | 16 | 15 | 14 | 13 | 12 | 11 |
| 51 | 0.992 | 25 | 25 | 24 | 23 | 22 | 21 | 21 | 21 | 19 | 18 | 17 | 16 | 15 | 14 | 13 | 12 |
| 52 | 0.994 | 27 | 27 | 26 | 25 | 24 | 23 | 23 | 23 | 21 | 20 | 19 | 18 | 17 | 16 | 15 | 14 |
| 53 | 0.995 | 28 | 28 | 27 | 26 | 25 | 24 | 24 | 24 | 22 | 21 | 20 | 19 | 18 | 17 | 16 | 15 |
| 54 | 0.997 | 29 | 29 | 28 | 27 | 26 | 25 | 25 | 25 | 23 | 22 | 21 | 20 | 19 | 18 | 17 | 16 |

| k | $\theta_{min}$ | | | | | | Huffman code lengths for groups of values of Σ | | | | | | | | | |
|---|---|---|---|---|---|---|---|---|---|---|---|---|---|---|---|---|
| 0 | 0.2 | 17 | 18 | 19 | 20 | 21 | 22 | 23 | 24 | 25 | 26 | 27 | 28 | 29 | 30 | 31 | 31 |
| 1 | 0.237 | 16 | 17 | 18 | 19 | 20 | 21 | 22 | 23 | 24 | 25 | 26 | 27 | 28 | 29 | 30 | 30 |
| 2 | 0.343 | 15 | 16 | 17 | 18 | 19 | 20 | 21 | 22 | 23 | 24 | 25 | 26 | 27 | 28 | 29 | 29 |
| 3 | 0.414 | 14 | 15 | 16 | 17 | 18 | 19 | 20 | 21 | 22 | 23 | 24 | 25 | 26 | 27 | 28 | 28 |
| 4 | 0.44 | 13 | 14 | 15 | 16 | 17 | 18 | 19 | 20 | 21 | 22 | 23 | 24 | 25 | 26 | 27 | 27 |
| 5 | 0.448 | 13 | 14 | 15 | 16 | 17 | 18 | 19 | 20 | 21 | 22 | 23 | 24 | 25 | 26 | 27 | 27 |
| 6 | 0.454 | 13 | 14 | 15 | 16 | 17 | 18 | 19 | 20 | 21 | 22 | 23 | 24 | 25 | 26 | 27 | 27 |
| 7 | 0.485 | 12 | 13 | 14 | 15 | 16 | 17 | 18 | 19 | 20 | 21 | 22 | 23 | 24 | 25 | 26 | 26 |
| 8 | 0.542 | 12 | 13 | 14 | 15 | 16 | 17 | 18 | 19 | 20 | 21 | 22 | 23 | 24 | 25 | 26 | 26 |
| 9 | 0.548 | 12 | 13 | 14 | 15 | 16 | 17 | 18 | 19 | 20 | 21 | 22 | 23 | 21 | 23 | 26 | 26 |
| 10 | 0.579 | 12 | 13 | 14 | 15 | 16 | 17 | 18 | 19 | 20 | 21 | 22 | 23 | 24 | 25 | 26 | 26 |
| 11 | 0.584 | 11 | 12 | 13 | 14 | 15 | 16 | 17 | 18 | 19 | 20 | 21 | 22 | 23 | 24 | 25 | 25 |
| 12 | 0.59 | 11 | 12 | 13 | 14 | 15 | 16 | 17 | 18 | 19 | 20 | 21 | 22 | 23 | 24 | 25 | 25 |
| 13 | 0.602 | 11 | 12 | 13 | 14 | 15 | 16 | 17 | 18 | 19 | 20 | 21 | 22 | 23 | 24 | 25 | 25 |
| 14 | 0.625 | 11 | 12 | 13 | 14 | 15 | 16 | 17 | 18 | 19 | 20 | 21 | 22 | 23 | 24 | 25 | 25 |
| 15 | 0.629 | 10 | 11 | 12 | 13 | 14 | 15 | 16 | 17 | 18 | 19 | 20 | 21 | 22 | 23 | 24 | 24 |
| 16 | 0.645 | 10 | 11 | 12 | 13 | 14 | 15 | 16 | 17 | 18 | 19 | 20 | 21 | 22 | 23 | 24 | 24 |
| 17 | 0.646 | 10 | 11 | 12 | 13 | 14 | 15 | 16 | 17 | 18 | 19 | 20 | 21 | 22 | 23 | 24 | 24 |

TABLE 2-continued

Code tables for transmission of parameter Σ (n = 4, theta ∈ [0.2, 0.999]).

| | | | | | | | | | | | | | | | | |
|---|---|---|---|---|---|---|---|---|---|---|---|---|---|---|---|---|
| 18 | 0.659 | 10 | 11 | 12 | 13 | 14 | 15 | 16 | 17 | 18 | 19 | 20 | 21 | 22 | 23 | 24 | 24 |
| 19 | 0.661 | 10 | 11 | 12 | 13 | 14 | 15 | 16 | 17 | 18 | 19 | 20 | 21 | 22 | 23 | 24 | 24 |
| 20 | 0.68 | 10 | 11 | 12 | 13 | 14 | 15 | 16 | 17 | 18 | 19 | 20 | 21 | 22 | 23 | 24 | 24 |
| 21 | 0.689 | 10 | 11 | 12 | 13 | 14 | 15 | 16 | 17 | 18 | 19 | 20 | 21 | 22 | 23 | 24 | 24 |
| 22 | 0.706 | 9 | 10 | 11 | 12 | 13 | 14 | 15 | 16 | 17 | 18 | 19 | 20 | 21 | 22 | 23 | 23 |
| 23 | 0.737 | 9 | 10 | 11 | 12 | 13 | 14 | 15 | 16 | 17 | 18 | 19 | 20 | 21 | 22 | 23 | 23 |
| 24 | 0.759 | 8 | 10 | 11 | 12 | 13 | 14 | 15 | 16 | 17 | 18 | 19 | 20 | 21 | 22 | 23 | 23 |
| 25 | 0.779 | 7 | 10 | 11 | 12 | 13 | 14 | 15 | 16 | 17 | 18 | 19 | 20 | 21 | 22 | 23 | 23 |
| 26 | 0.8 | 6 | 9 | 11 | 12 | 13 | 14 | 15 | 16 | 17 | 18 | 19 | 20 | 21 | 22 | 23 | 23 |
| 27 | 0.81 | 5 | 7 | 10 | 11 | 12 | 13 | 14 | 15 | 16 | 17 | 18 | 19 | 20 | 21 | 22 | 22 |
| 28 | 0.832 | 4 | 6 | 8 | 11 | 12 | 13 | 14 | 15 | 16 | 17 | 18 | 19 | 20 | 21 | 22 | 22 |
| 29 | 0.843 | 4 | 5 | 7 | 10 | 12 | 13 | 14 | 15 | 16 | 17 | 18 | 19 | 20 | 21 | 22 | 22 |
| 30 | 0.861 | 4 | 4 | 6 | 7 | 10 | 12 | 13 | 14 | 15 | 16 | 17 | 18 | 19 | 20 | 21 | 21 |
| 31 | 0.87 | 3 | 4 | 5 | 7 | 10 | 13 | 14 | 15 | 16 | 17 | 18 | 19 | 20 | 21 | 22 | 22 |
| 32 | 0.883 | 3 | 3 | 5 | 6 | 8 | 11 | 13 | 14 | 15 | 16 | 17 | 18 | 19 | 20 | 21 | 21 |
| 33 | 0.893 | 3 | 3 | 4 | 6 | 7 | 9 | 12 | 14 | 15 | 16 | 17 | 18 | 19 | 20 | 21 | 21 |
| 34 | 0.902 | 3 | 3 | 4 | 4 | 6 | 8 | 11 | 14 | 15 | 16 | 17 | 18 | 19 | 20 | 21 | 21 |
| 35 | 0.91 | 3 | 3 | 3 | 4 | 5 | 7 | 9 | 13 | 15 | 16 | 17 | 18 | 19 | 20 | 21 | 21 |
| 36 | 0.922 | 3 | 3 | 3 | 3 | 5 | 6 | 8 | 10 | 13 | 15 | 16 | 17 | 18 | 19 | 20 | 20 |
| 37 | 0.927 | 3 | 3 | 3 | 3 | 4 | 5 | 7 | 10 | 13 | 16 | 17 | 18 | 19 | 20 | 21 | 21 |
| 38 | 0.935 | 3 | 3 | 3 | 3 | 3 | 5 | 6 | 8 | 10 | 14 | 16 | 17 | 18 | 19 | 20 | 20 |
| 39 | 0.941 | 3 | 3 | 3 | 3 | 3 | 4 | 5 | 7 | 9 | 12 | 16 | 17 | 18 | 19 | 20 | 20 |
| 40 | 0.948 | 3 | 3 | 3 | 3 | 3 | 3 | 4 | 6 | 7 | 10 | 14 | 17 | 18 | 19 | 20 | 20 |
| 41 | 0.956 | 4 | 3 | 3 | 3 | 3 | 3 | 5 | 6 | 8 | 11 | 14 | 18 | 19 | 20 | 20 | 20 |
| 42 | 0.961 | 4 | 3 | 3 | 3 | 3 | 3 | 4 | 5 | 7 | 10 | 13 | 18 | 21 | 22 | 22 | 22 |
| 43 | 0.965 | 5 | 4 | 3 | 3 | 3 | 3 | 3 | 4 | 6 | 7 | 10 | 14 | 18 | 20 | 20 | 20 |
| 44 | 0.971 | 5 | 4 | 4 | 3 | 3 | 3 | 3 | 3 | 5 | 6 | 8 | 11 | 15 | 19 | 20 | 20 |
| 45 | 0.975 | 6 | 5 | 4 | 3 | 3 | 3 | 3 | 3 | 4 | 5 | 6 | 9 | 12 | 16 | 20 | 20 |
| 46 | 0.978 | 7 | 5 | 5 | 4 | 3 | 3 | 3 | 3 | 3 | 4 | 5 | 7 | 10 | 13 | 18 | 18 |
| 47 | 0.982 | 7 | 7 | 5 | 5 | 4 | 3 | 3 | 3 | 3 | 3 | 4 | 5 | 7 | 10 | 14 | 14 |
| 48 | 0.985 | 8 | 8 | 6 | 5 | 5 | 4 | 3 | 3 | 3 | 3 | 3 | 4 | 5 | 8 | 11 | 11 |
| 49 | 0.988 | 9 | 8 | 8 | 6 | 5 | 5 | 4 | 3 | 3 | 3 | 3 | 3 | 4 | 5 | 8 | 8 |
| 50 | 0.99 | 10 | 9 | 8 | 7 | 6 | 6 | 4 | 4 | 3 | 3 | 3 | 3 | 3 | 4 | 6 | 6 |
| 51 | 0.992 | 11 | 10 | 9 | 8 | 7 | 6 | 5 | 4 | 4 | 3 | 3 | 3 | 3 | 3 | 3 | 4 |
| 52 | 0.994 | 13 | 12 | 11 | 10 | 9 | 8 | 7 | 6 | 5 | 4 | 3 | 3 | 3 | 2 | 3 | 3 |
| 53 | 0.995 | 14 | 13 | 12 | 11 | 10 | 9 | 8 | 7 | 6 | 5 | 4 | 3 | 3 | 2 | 2 | 3 |
| 54 | 0.997 | 15 | 14 | 13 | 12 | 11 | 10 | 9 | 8 | 7 | 6 | 5 | 4 | 3 | 2 | 2 | 2 |

In Table 2, the Huffman codes utilize a full range of codelengths, from left-way unary code to right-way skewed code, which is similar to unary codes.

In this way, the generalized Golomb code may be constructed in accordance with the techniques described in this disclosure. First, the entropy encoder, such as entropy coding unit 46 shown in the example of FIG. 3, computes the sum Σ in accordance with equation (2) shown above. Next, entropy coding unit 46 computes the sum index ξ in accordance with equation (4). Entropy coding unit 46 then splits the computed sum Σ into two parts: a group number g(Σ) and an index within the group k(Sigma). To split the sum, entropy coding unit 46 scans the group table, e.g., Table 1 listed above using θ. If θ is known (e.g., as a context), entropy coding unit 46 selects the index of a Huffman code j producing the best match by scanning the table of parameter-ranges for Huffman codes, such as, for example, the above listed Table 2. Entropy coding unit 46 then formulates or generates the generalized Golomb code by encoding group g(Σ) using j-th Huffman code, encoding Σ's index within a group k using a uniform code, and encoding an index of an input block ξ($i_1, \ldots, i_n$) in a set of blocks with total Σ using a uniform code.

Various implementation aspects are discussed below for exemplary purposes with that discuss an example way of implementing the coding techniques described in this disclosure. While these implementation aspects are provided, the techniques of this disclosure should not be limited to this particular implementation, which again is provided only for exemplary purposes.

To illustrate various implementation aspects of the techniques, first consider a prefix code for uniform distributions. As noted above, codes for indices ξ that are uniformly distributed in some known range, e.g., ξ ∈ [0, 1–1]. It is known that such uniform codes are special cases of Huffman codes in which values $\xi < 2^{\lfloor \log_2 l \rfloor + 1} - 1$ are mapped into codewords of length $\lfloor \log_2 l \rfloor$, and the remaining values are assigned codewords of length $\lfloor \log_2 l \rfloor + 1$. For further examples of algorithms that work with such codes, see the following Algorithms 1 and 2 listed below. With respect to these Algorithms 1 and 2, they implement only a few operations (1-2 comparisons and bit stuffing) to perform the encoding/decoding operations.

Algorithm 1 Encoding of uniform codes.

```
/*
 * Encode a symbol (x) using a uniform code for m-ary alphabet.
 */
void uni_encode (unsigned int x, unsigned int m, BS *p)
{
    unsigned int k, l;
    /* compute l,k: */
    l = int_log2_24(m);
    if (m > (1U << l)) {
        k = (1U << (l+1)) - m;   /* k > 0 ! */
        if (x < k) goto use_l_bits;
        /* use l+1 bits: */
        put_bits (x+k, l+1, p);
    } else {
        use_l_bits:
        /* l bits is enough: */
        put_bits (x, l, p);
    }
}
```

Algorithm 2 Decoding of uniform codes.

```
/*
 * Decode a symbol encoded using a uniform code.
 */
unsigned int uni_decode (unsigned int m, BS *p)
{
    unsigned int k, l, x;
    /* compute l, and read first l bits: */
    l = int_log2_24(m);
    x = get_bits (l, p);
    /* compute k and check x: */
    if (m > (1U << l)) {
        k = (1U << (l+1)) - m;   /* k > 0 ! */
```

$$\xi(0, 0, \ldots, 0, \Sigma) = 0, \xi(0, 0, \ldots, 1, \Sigma\text{-}1)$$
$$= 0, \ldots, \xi(\Sigma, 0, \ldots, 0, 0)$$
$$= \left(\binom{n}{\Sigma}0 - 1.\right)$$

The above equation (11) may be implemented using only addition operations if there is a computed array of multiset coefficients, where the number of additions requires is equal to $\Sigma-1$. Example algorithms for computing this aspect of the techniques is provided in the following Algorithms 3-5.

Algorithm 3 Computing multiset coefficients.

```
/* Pascal's triangle: */
static long long *binomial[S_MAX+1], b_data[(S_MAX+1) * (S_MAX+2) / 2];
/* initialize Pascal triangle */
void init_counting (void)
{
    int s, k; long long *b = b_data;
    for (s=0; s<=S_MAX; s++) {
        binomial[s] = b; b += s + 1;              /* allocate a row */
        binomial[s][0] = binomial[s][s] = 1;      /* set 1st & last coeffs */
        for (k=1; k<s; k++)                       /* compute ones in the middle */
            binomial[s][k] = binomial[s-1][k-1] + binomial[s-1][k];
    }
}
/* multiset coefficient: */
long long multiset(int s, int n)
{
    return binomial[s+n-1][n-1];
}
```

-continued

Algorithm 2 Decoding of uniform codes.

```
        if (x >= k) {
            /* read one more bit: */
            x = (x << 1) + get_bit (p);
            x -= k;    /* recover original value */
        }
    }
    return x;
}
```

Another implementation aspect of the techniques described in this disclosure concerns the enumeration of n-tuples with the same total $\Sigma$. The mapping defined in equation (4) above requires such an enumeration in that it defines a mapping associating each block $i_1, \ldots, i_n$ in a set of all possible blocks with total $\Sigma$ with a unique index $\xi$. By induction it can be shown that such index $\xi$ can be computed in accordance with the following equation 11:

$$\xi(i_1, i_2, \ldots, i_n) = \sum_{j=1}^{n-2} \sum_{k=0}^{i_j-1} \left(\binom{n-j}{\Sigma - k - \sum_{l=1}^{j-1} i_l}\right)\binom{\Sigma - i + n - j}{n - j} + i_{n-1}. \quad (11)$$

In essence, equation (11) implements lexicographic counting (assuming that $i_1$ is the most significant sample, and $i_m$ is the least significant) of sets of sample values. For example, Algorithm 4 Computing index of a block with known sum (s).

```
/*
 * Compute index:
 */
int index (int s, int n, int *t)
{
    int i, j, l, idx=0;
    for (i=0; i<n-2; i++) {
        l = 0;
        for (j=0; j<t[i]; j++)
            l += multiset(s-j, n-i-1);
        idx += l;
        s -= t[i];
    }
    idx += t[n-2];
    return idx;
}
```

Algorithm 5 Decoding of a block given its lexicographic index.

```
/*
 * Compute block, given its index:
 */
void block (int idx, int s, int n, int *t)
{
    int i, j, l, x;
    for (i=0; i<n-2; i++) {
        l = 0;
        for (j=0; j<s; j++) {
            x = multiset(s-j, n-i-1);
            if (idx - l < x) break;
            l += x;
```

-continued

Algorithm 5 Decoding of a block given its lexicographic index.

```
        }
        t[i] = j;
        idx -= l;
        s -= j;
    }
    t[n-2] = idx;
    t[n-1] = s - idx;
}
```

Rather than provided pre-computed multiset coefficient values, for small block sizes, multiplications may be used. For example, it can be shown that:

$$\xi(i_1, i_2) = i_1,$$

$$\xi(i_1, i_2, i_3) = \frac{(i_1 + 1)(2\Sigma - i_1 + 2)}{2} + i_2,$$

$$\xi(i_1, i_2, i_3, i_4) =$$
$$\frac{(i_1 + 1)(3\Sigma + 3 - i_1) + i_1(i_1 - 4) + 6)}{6} + \frac{(i_2 + 1)(2(\Sigma - i_1) - i_2 + 2)}{2} + i_3,$$

etc.

In the above equalities, the divisions listed above by small integer numbers can be replaced by multiplications and shifts, meaning that multiplications can be used to compute multiset coefficient values. In this way, various aspects of the techniques may be implemented in such a manner that limits the number of operations required to compute the generalized Golomb codes while also taking into consideration storage requirements (in terms of the number and size of tables). A number of implementation decisions may therefore be made to tailor a given implementation of the techniques described in this disclosure to meet a particular context or application.

Figure 8:
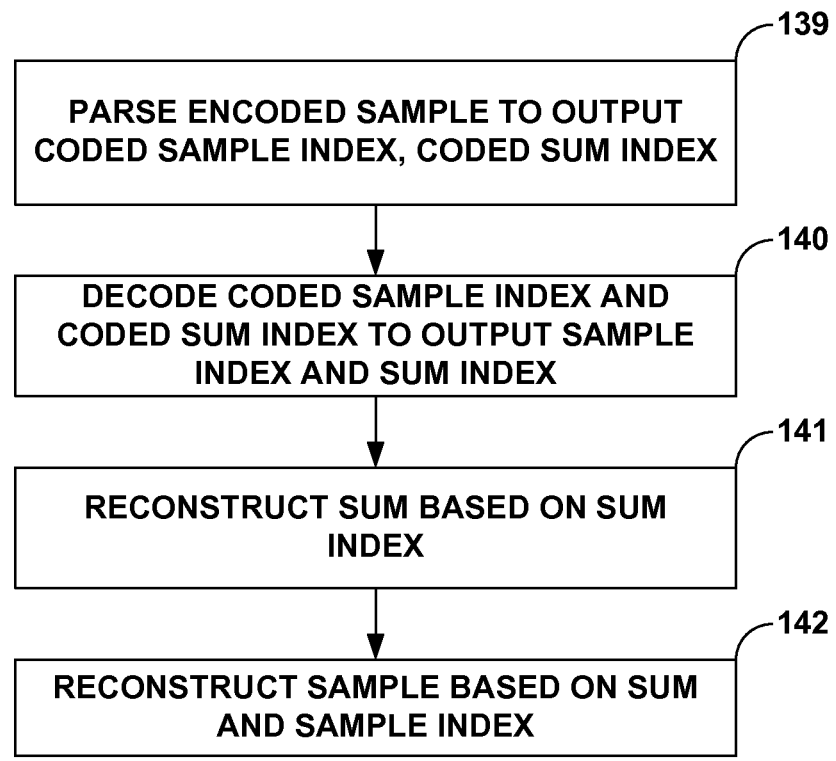
FIG. 8 is a flowchart illustrating exemplary operation of a coding device in performing the coding techniques described in this disclosure.

FIG. 8 is a flowchart illustrating exemplary operation of a coding device, such as entropy decoding unit 80 of FIG. 5, in performing the coding techniques described in this disclosure. Initially, entropy decoding unit 80 receives coded sample 100, which as described above may comprise of coded quantized DCT coefficients, and stores coded sample 100 to storage unit 102. Inverse format unit 104 accesses storage unit 102 to retrieve coded sample 100, which it then parses to output coded sample index 72, coded sum index 74 and coded group number 70 (139). UD unit 106 receives coded sample index 72 and coded sum index 74 and performs an inverse form of uniform coding to output sample index 62 and sum index 68 (140). Based on sum index 68, sum reconstruction unit 110 reconstructs sum 64 by performing operations inverse to those performed by those units of coding device described above (141). Based on sample index 62 and sum 64, sample reconstruction unit 112 performs operations inverse to those performed by lexicographic counting unit 52 to reconstruct the sample in the manner described above (142).

Figure 9:
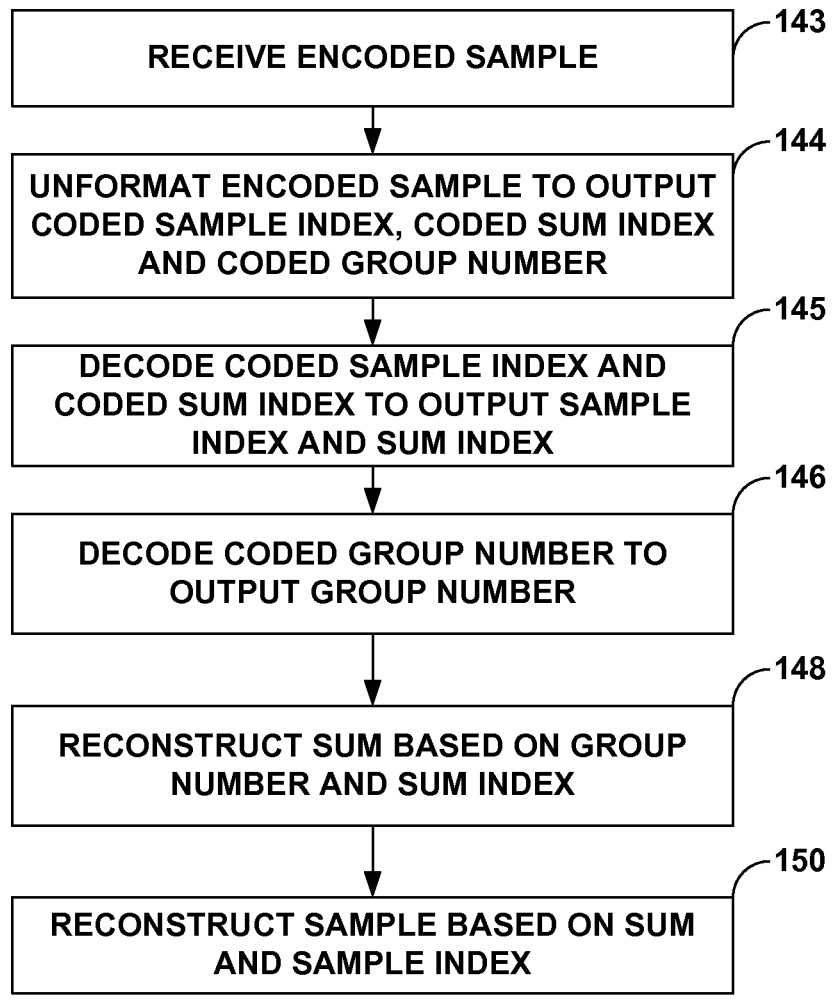
FIG. 9 is a flowchart illustrating exemplary operation of a coding device in performing the coding, techniques described in this disclosure in more detail.

FIG. 9 is a flowchart illustrating exemplary operation of a coding device, such as entropy decoding unit 80 of FIG. 5, in performing the coding techniques described in this disclosure in more detail. Initially, entropy decoding unit 80 receives coded sample 100 (143), which as described above may comprise of coded quantized DCT coefficients, and stores coded sample 100 to storage unit 102. Inverse format unit 104 accesses storage unit 102 to retrieve coded sample 100, which it then un-formats to output coded sample index 72, coded sum index 74 and coded group number 70 (144). UD unit 106 receives coded sample index 72 and coded sum index 74 and performs an inverse form of uniform coding to output sample index 62 and sum index 68 (145). VLD unit 108, meanwhile, receives coded group number 70 and performs an inverse form of variable length coding, e.g., inverse Huffman coding, to output group number 66 (146). Based on group number 66 and sum index 68, sum reconstruction unit 110 reconstructs sum 64 by performing operations inverse to those performed by grouping unit 55 (148). Sum reconstruction unit 110 outputs sum 64 to sample reconstruction unit 112, which also receives sample index 62. Based on sample index 62 and sum 64, sample reconstruction unit 112 performs operations inverse to those performed by lexicographic counting unit 52 to reconstruct the sample in the manner described above (150).

Figure 10:
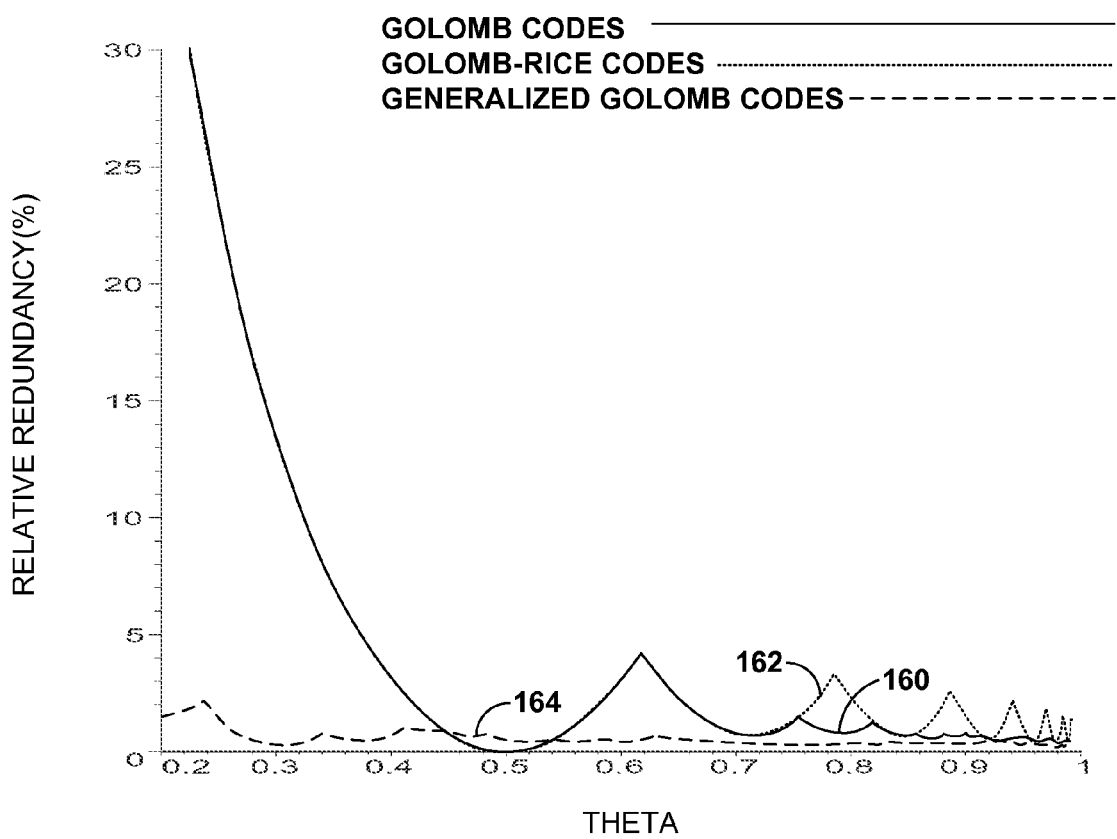
FIG. 10 is a graph illustrating relative redundancy of conventional Golomb codes and Golomb-Rice codes in comparison to the generalized Golomb code constructed in accordance with the techniques described in this disclosure.

FIG. 10 is a graph illustrating relative redundancy of conventional Golomb codes and Golomb-Rice codes in comparison to the generalized Golomb code constructed in accordance with the techniques described in this disclosure. In the graph of FIG. 8, the y-axis denotes relative redundancy in terms of a percentage while the x-axis denotes the spread parameter theta, θ. Plots of redundancy for Golomb codes, Golomb-Rice codes and the generalized Golomb codes described in this disclosure are provided assuming a block size n equal to 4. The redundancy of Golomb codes as it varies by theta is shown as a solid line 160. The redundancy of Golomb-Rice codes as it varies by theta is shown as a dotted line 162. The redundancy of the generalized Golomb codes described in this disclosure as it varies by theta is shown as a dashed line 164. From the graph shown in FIG. 8, it is clear that the generalized Golomb codes constructed in accordance with the techniques described by way of example in this disclosure are more robust in terms of redundancy across all theta values and exhibit lower redundancy fluctuations. Moreover, in terms of redundancy savings, the generalized Golomb codes described in this disclosure provide significant savings for lower range of values of parameter theta, which is especially beneficial as lower theta values are very common in practice. While shown with respect to block sizes equal to four, redundancy may be even more reduced by taking larger blocks and the techniques described in this disclosure should not be limited to this block size of four.

The techniques described in this disclosure may be implemented within one or more of a general purpose microprocessor, digital signal processor (DSP), application specific integrated circuit (ASIC), field programmable gate array (FPGA), programmable logic devices (PLDs), or other equivalent logic devices. Accordingly, the terms "processor" or "controller," as used herein, may refer to any one or more of the foregoing structures or any other structure suitable for implementation of the techniques described herein.

The various components illustrated herein may be realized by any suitable combination of hardware, software or firmware executed by a processor, or any combination thereof. In the figures, various components are depicted as separate units or modules. However, all or several of the various components described with reference to these figures may be integrated into combined units or modules within common hardware, and/or firmware or other software executed by a processor or other hardware. Accordingly, the representation of features as components, units or modules is intended to highlight particular functional features for ease of illustration, and does not necessarily require realization of such features by separate hardware, firmware, or software components. In some cases, various units may be implemented as programmable processes performed by one or more processors.

Any features described herein as modules, devices, or components may be implemented together in an integrated logic device or separately as discrete but interoperable logic devices. In various aspects, such components may be formed at least in part as one or more integrated circuit devices, which may be referred to collectively as an integrated circuit device, such as an integrated circuit chip or chipset. Such circuitry may be provided in a single integrated circuit chip device or in multiple, interoperable integrated circuit chip devices, and may be used in any of a variety of image, display, audio, or other multi-multimedia applications and devices. In some aspects, for example, such components may form part of a mobile device, such as a wireless communication device handset (e.g., a mobile telephone handset).

If implemented in software, the techniques may be realized at least in part by a computer-readable data storage medium storing code with instructions that, when executed by one or more processors, performs one or more of the methods described above. The computer-readable storage medium may form part of a computer program product, which may include packaging materials. The computer-readable medium may comprise a non-transitory storage medium such as random access memory (RAM) such as synchronous dynamic random access memory (SDRAM), read-only memory (ROM), non-volatile random access memory (NVRAM), electrically erasable programmable read-only memory (EEPROM), embedded dynamic random access memory (eDRAM), static random access memory (SRAM), flash memory, magnetic or optical data storage media. To the extent such mediums are embodied as physical storage devices or memories, the computer-readable medium may represent a non-transitory computer readable medium. Any software that is utilized may be executed by one or more processors, such as one or more DSP's, general purpose microprocessors, ASIC's, FPGA's, or other equivalent integrated or discrete logic circuitry.

Various aspects have been described in this disclosure. These and other aspects are within the scope of the following claims.

The invention claimed is:

1. A method of encoding a stream of data comprising multiple samples, each of which includes a set of values, the method comprising:

computing a sum of the values in the set of a first sample of the multiple samples;

determining a sample index that uniquely identifies the first sample from samples that have the same number of values as the set of the first sample and the same sum as the sum computed for the first sample;

identifying a group number and a sum index corresponding to the sum for the first sample;

coding based at least in part on a spread parameter, the group number using a variable-length code to generate a coded group number, wherein the stream of data is fitted to a geometric or double geometric distribution based at least in part on the spread parameter;

coding the sample index and the sum index using a uniform code to generate a coded sample index and a coded sum index, wherein the uniform code comprises a fixed length code or a code in which the difference between code lengths is at most one;

formatting the coded group number, the coded sum index, and the coded sample index to form a portion of a bitstream; and outputting the portion of the bitstream.

2. The method of claim 1, wherein the sample index uniquely identifies the first sample based on a lexicographical ordering of the samples that have the same number of values as the set of the first sample and the same sum as the sum computed for the first sample.

3. The method of claim 1, further comprising:

storing group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums, wherein identifying a group number corresponding to the sum for the first sample comprises identifying a group number assigned to the group to which the sum for the first sample belongs, and wherein identifying a sum index corresponding to the sum for the first sample comprises identifying a sum index assigned to the sum for the first sample within the group to which the sum for the first sample belongs.

4. The method of claim 1, wherein coding the group number comprises coding the group number using a Huffman code to generate the coded group number.

5. The method of claim 1, further comprising:

storing a plurality of code tables, each of which corresponds to a different range of the spread parameter;

determining a value for the spread parameter; and selecting one of the code tables based on the value for the spread parameter, wherein coding the group number comprises coding the group number using the selected one of the code tables to generate the coded group number.

6. The method of claim 1, wherein the stream of data comprises video data defining the multiple samples, wherein each of the multiple samples includes residual video data or discrete cosine transform (DCT) coefficients, and wherein the method is performed at least partially by a coding device that comprises a video encoder.

7. A device for encoding a stream of data comprising multiple samples, each of which includes a set of values, the device comprising:

a lossless coding unit that includes:

a sample summation unit that computes a sum of the values in the set of a first sample of the multiple samples;

a counting unit that determines a sample index that uniquely identifies the first sample from samples that have the same number of values as the set of the first sample and the same sum as the sum computed for the first sample;

a grouping unit that identifies a group number and a sum index corresponding to the sum for the first sample;

a variable length coding unit that codes based at least in part on a spread parameter, the group number using a variable-length code to generate a coded group number, wherein the stream of data is fitted to a geometric or double geometric distribution based at least in part on the spread parameter;

a uniform coding unit that codes the sample index and the sum index using a uniform code to generate a coded sample index and a coded sum index, wherein the uniform code comprises a fixed length code or a code in which the difference between code lengths is at most one; and a format unit that formats the coded group number, the coded sum index, and the coded sample index to form a portion of a bitstream and outputs the portion of the bitstream.

8. The device of claim 7, wherein the sample index uniquely identifies the first sample based on a lexicographical ordering of the samples that have the same number of values as the set of the first sample and the same sum as the sum computed for the first sample.

9. The device of claim 7,
wherein the grouping unit stores group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums,
wherein the grouping unit identifies the group number corresponding to the sum for the first sample by identifying a group number assigned to the group to which the sum for the first sample belongs, and identifies the sum index corresponding to the sum for the first sample by identifying a sum index assigned to the sum for the first sample within the group to which the sum for the first sample belongs.

10. The device of claim 7, wherein the variable length coding unit codes the group number using a Huffman code to generate the coded group number.

11. The device of claim 7,
wherein the variable length coding unit stores a plurality of code tables, each of which corresponds to a different range of the spread parameter, determines a value for the spread parameter, and selects one of the code tables based on the value for the spread parameter, and
wherein the variable length coding unit codes the group number using the selected one of the code tables to generate the coded group number.

12. The device of claim 7,
wherein the stream of data comprises video data defining the multiple samples,
wherein each of the multiple samples includes residual video data or discrete cosine transform (DCT) coefficients, and
wherein the device comprises a video encoder that includes one or more of the lossless coding unit, the sample summation unit, the counting unit, the sample summation unit, the grouping unit, the variable length coding unit, the uniform coding unit, and the format unit.

13. An apparatus for encoding a stream of data comprising multiple samples, each of which includes a set of values, the apparatus comprising:
means for computing a sum of the values in the set of a first sample of the multiple samples;
means for determining a sample index that uniquely identifies the first sample from samples that have the same number of values as the set of the first sample and the same sum as the sum computed for the first sample;

means for identifying a group number and a sum index corresponding to the sum for the first sample;
means for coding based at least in part on a spread parameter, the group number using a variable-length code to generate a coded group number, wherein the stream of data is fitted to a geometric or double geometric distribution based at least in part on the spread parameter;
means for coding the sample index and the sum index using a uniform code to generate a coded sample index and a coded sum index, wherein the uniform code comprises a fixed length code or a code in which the difference between code lengths is at most one;
means for formatting the coded group number, the coded sum index, and the coded sample index to form a portion of a bitstream; and
means for outputting the portion of the bitstream.

14. The apparatus of claim 13, wherein the sample index uniquely identifies the first sample based on a lexicographical ordering of the samples that have the same number of values as the set of the first sample and the same sum as the sum computed for the first sample.

15. The apparatus of claim 13, further comprising:
means for storing group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums,
wherein the means for identifying a group number corresponding to the sum for the first sample comprises means for identifying a group number assigned to the group to which the sum for the first sample belongs; and
wherein the means for identifying a sum index corresponding to the sum for the first sample comprises means for identifying a sum index assigned to the sum for the first sample within the group to which the sum for the first sample belongs.

16. The apparatus of claim 13, wherein the means for coding the group number comprises means for coding the group number using a Huffman code to generate the coded group number.

17. The apparatus of claim 13, further comprising:
means for storing a plurality of code tables, each of which corresponds to a different range of the spread parameter;
means for determining a value for the spread parameter; and
means for selecting one of the code tables based on the value for the spread parameter,
wherein the means for coding the group number comprises means for coding the group number using the selected one of the code tables to generate the coded group number.

18. The apparatus of claim 13,
wherein the stream of data comprises video data defining the multiple samples,
wherein each of the multiple samples includes residual video data or discrete cosine transform (DCT) coefficients, and
wherein the apparatus comprises a video encoder that includes one or more of the means for computing, the means for determining, the means for identifying, the means for coding, the means for formatting, and the means for outputting.

19. A non-transitory computer-readable storage medium having stored thereon instructions that when executed cause a processor to:
receive a stream of data defining multiple samples, each of which includes a set of values;
compute a sum of the values in the set of a first sample of the multiple samples;
determine a sample index that uniquely identifies the first sample from samples that have the same number of values as the set of the first sample and the same sum as the sum computed for the first sample;
identify a group number and a sum index corresponding to the sum for the first sample;
code based at least on a spread parameter, the group number using a variable-length code to generate a coded group number, wherein the stream of data is fitted to a geometric or double geometric distribution based at least in part on the spread parameter;
code the sample index and the sum index using a uniform code to generate a coded sample index and a coded sum index, wherein the uniform code comprises a fixed length code or a code in which the difference between code lengths is at most one;
format the coded group number, the coded sum index, and the coded sample index to form a portion of a bitstream; and
output the portion of the bitstream.

20. The non-transitory computer-readable storage medium of claim 19, wherein the sample index uniquely identifies the first sample based on a lexicographical ordering of the samples that have the same number of values as the set of the first sample and the same sum as the sum computed for the first sample.

21. The non-transitory computer-readable storage medium of claim 19, wherein the instructions, when executed, further cause the processor to:
store group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums;
identify the group number corresponding to the sum for the first sample by identifying a group number assigned to the group to which the sum for the first sample belongs; and
identify the sum index corresponding to the sum for the first sample by identifying a sum index assigned to the sum for the first sample within the group to which the sum for the first sample belongs.

22. The non-transitory computer-readable storage medium of claim 19, wherein the instructions, when executed, further cause the processor to:
store a plurality of code tables, each of which corresponds to a different range of the spread parameter;
determine a value for the spread parameter;
select one of the code tables based on the value for the spread parameter; and
code the group number by coding the group number using the selected one of the code tables to generate the coded group number.

23. The non-transitory computer-readable storage medium of claim 19,
wherein the multiple samples are defined within video data,
wherein each of the multiple samples includes residual video data or discrete cosine transform (DCT) coefficients, and
wherein the processor comprises a video encoder.

24. A method for decoding a stream of data comprising multiple encoded samples, the method comprising:
decoding a coded group number corresponding to a first encoded sample of the multiple encoded samples using a variable-length code to generate a group number, wherein the decoding is based at least in part on a spread parameter that fits the stream of data to a geometric or double geometric distribution;
decoding a coded sample index and a coded sum index corresponding to the first encoded sample using a uniform code to generate a sample index and a sum index, wherein the uniform code comprises a fixed-length code or a code in which the difference between code lengths is at most one;
identifying, based on the group number and the sum index, a sum of a set of values for a first sample corresponding to a decoded version of the first encoded sample; and
reconstructing the first sample based on the sum for the first sample and the sample index, wherein the sample index uniquely identifies the first sample from samples that have the same number of values as the set of the first sample and the same sum as the sum for the first sample.

25. The method of claim 24, wherein the sample index uniquely identifies the first sample based on a lexicographic ordering of the samples that have the same number of values as the set of the first sample and the same sum as the sum for the first sample.

26. The method of claim 24, further comprising:
storing group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums,
wherein identifying a sum of a set of values for a first sample corresponding to a decoded version of the first encoded sample based on the group number and the sum index comprises identifying the group to which the sum for the first sample belongs based on the group number and identifying the sum for the first sample from within the identified group based on the sum index.

27. The method of claim 24, further comprising:
storing a plurality of code tables, each of which corresponds to a different range of the spread parameter;
determining a value for the spread parameter; and
selecting one of the code tables based on the value for the spread parameter, wherein decoding the coded group number comprises decoding the coded group number using the selected one of the code tables to generate the group number.

28. The method of claim 24,
wherein the stream of data comprises encoded video data defining the multiple encoded samples,
wherein each of the multiple encoded samples includes information corresponding to residual video data or discrete cosine transform (DCT) coefficients, and
wherein the method is performed at least partially by a decoding device that comprises a video decoder.

29. A device for decoding a stream of data comprising multiple encoded samples, the device comprising:
a variable length decoding unit that decodes a coded group number corresponding to a first encoded sample of the multiple encoded samples using a variable-length code to generate a group number, wherein the decoding is based at least in part on a spread parameter that fits the stream of data to a geometric or double geometric distribution;
a uniform decoding unit that decodes a coded sample index and a coded sum index corresponding to the first encoded sample using a uniform code to generate a sample index and a sum index, wherein the uniform code comprises a fixed-length code or a code in which the difference between code lengths is at most one;
a sum reconstruction unit that identifies, based on the group number and the sum index, a sum of a set of values for a first sample corresponding to a decoded version of the first encoded sample; and
a sample reconstruction unit that reconstructs the first sample based on the sum for the first sample and the sample index, wherein the sample index uniquely identifies the first sample from samples that have the same number of values as the set of the first sample and the same sum as the sum for the first sample.

30. The device of claim 29, wherein the sample index uniquely identifies the first sample based on a lexicographic ordering of the samples that have the same number of values as the set of the first sample and the same sum as the sum for the first sample.

31. The device of claim 29,
wherein the sum reconstruction unit further stores group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums, and identifies the sum of the set of values for the first sample corresponding to a decoded version of the first encoded sample based on the group number and the sum index by identifying the group to which the sum for the first sample belongs based on the group number and identifying the sum for the first sample from within the identified group based on the sum index.

32. The device of claim 29, wherein the variable length decoding unit stores a plurality of code tables, each of which corresponds to a different range of the spread parameter, determines a value for the spread parameter, selects one of the code tables based on the value for the spread parameter and decodes the coded group number using the selected one of the code tables to generate the group number.

33. The device of claim 29,
wherein the stream of data comprises encoded video data defining the multiple encoded samples,
wherein each of the multiple encoded samples includes information corresponding to residual video data or discrete cosine transform (DCT) coefficients, and
wherein the device comprises a video decoder that includes one or more of the variable length decoding unit, the uniform decoding unit, the sum reconstruction unit, and the sample reconstruction unit.

34. An apparatus for decoding a stream of data comprising multiple encoded samples, the apparatus comprising:
means for decoding a coded group number corresponding to a first encoded sample of the multiple encoded samples using a variable-length code to generate a group number, wherein the decoding is based at least in part on a spread parameter that fits the stream of data to a geometric or double geometric distribution;
means for decoding a coded sample index and a coded sum index corresponding to the first encoded sample using a uniform code to generate a sample index and a sum index, wherein the uniform code comprises a fixed-length code or a code in which the difference between code lengths is at most one;
means for identifying, based on the group number and the sum index, a sum of a set of values for a first sample corresponding to a decoded version of the first encoded sample; and
means for reconstructing the first sample based on the sum for the first sample and the sample index, wherein the sample index uniquely identifies the first sample from samples that have the same number of values as the set of the first sample and the same sum as the sum for the first sample.

35. The apparatus of claim 34, wherein the sample index uniquely identifies the first sample based on a lexicographic ordering of the samples that have the same number of values as the set of the first sample and the same sum as the sum for the first sample.

36. The apparatus of claim 34,
wherein the apparatus further comprises:
means for storing group data defining groups, wherein each of the groups identifies one or more sums for samples from the stream of data as belonging to the group, wherein each of the groups is assigned a group number, wherein the sums within each group are organized according to a probability of occurrence of each sum in the stream of data, and wherein each sum within each group is assigned a sum index starting with zero to the first sum in the group with the highest probability of occurrence in the stream of data stream and increasing the sum index assigned to other sums in the group based on a descending order of probability of occurrence in the stream of data of the other sums;
wherein the means for identifying a sum of a set of values for the first sample corresponding to a decoded version of the first encoded sample based on the group number and the sum index comprises means for identifying the group to which the sum for the first sample belongs based on the group number and means for identifying the sum for the first sample from within the identified group based on the sum index.

37. The apparatus of claim 34, further comprising:
means for storing a plurality of code tables, each of which corresponds to a different range of the spread parameter;

means for determining a value for the spread parameter; and means for selecting one of the code tables based on the value for the spread parameter, wherein the means for decoding the coded group number comprises means for decoding the coded group number using the selected one of the code tables to generate the group number.

38. The apparatus of claim 34, wherein the stream of data comprises encoded video data defining the multiple encoded samples, wherein each of the multiple encoded samples includes information corresponding to residual video data or discrete cosine transform (DCT) coefficients, and wherein the apparatus comprises a video decoder that includes one of more of the means for decoding, the means for identifying, and the means for reconstructing.

39. A non-transitory computer-readable medium that stores instructions that, when executed by a processor, cause the processor to:

receive a stream of data defining multiple encoded samples;

decode a coded group number corresponding to a first encoded sample of the multiple encoded samples using a variable-length code to generate a group number, wherein the decoding is based at least in part on a spread parameter that fits the stream of data to a geometric or double geometric distribution;

decode a coded sample index and a coded sum index corresponding to the first encoded sample using a uniform code to generate a sample index and a sum index, wherein the uniform code comprises a fixed-length code or a code in which the difference between code lengths is at most one;

identify, based on the group number and the sum index, a sum of a set of values for a first sample corresponding to a decoded version of the first encoded sample; and reconstruct the first sample based on the sum for the first sample and the sample index, wherein the sample index uniquely identifies the first sample from samples that have the same number of values as the set of the first sample and the same sum as the sum for the first sample.

40. The non-transitory computer-readable medium of claim 39, wherein the stream of data comprises encoded video data defining the multiple encoded samples, wherein each of the multiple encoded samples includes information corresponding to residual video data or discrete cosine transform (DCT) coefficients, and wherein the processor comprises a video decoder.

* * * * *